(12) United States Patent  
Fike, III et al.

(10) Patent No.: US 9,122,047 B2  
(45) Date of Patent: Sep. 1, 2015

(54) PREVENTING GLASS PARTICLE INJECTION DURING THE OIL FILL PROCESS

(71) Applicant: Pixtronix, Inc., San Diego, CA (US)

(72) Inventors: Eugene E. Fike, III, Amesbury, MA (US); Timothy J. Brosnihan, Natick, MA (US)

(73) Assignee: Pixtronix, Inc., San Diego, CA (US)

( * ) Notice: Subject to any disclaimer, the term of this patent is extended or adjusted under 35 U.S.C. 154(b) by 0 days.

(21) Appl. No.: 13/731,511

(22) Filed: Dec. 31, 2012

(65) Prior Publication Data

US 2014/0185127 A1    Jul. 3, 2014

(51) Int. Cl.
```
G02B 26/00      (2006.01)
G02F 1/01       (2006.01)
G09G 3/00       (2006.01)
B81B 3/00       (2006.01)
```
(Continued)

(52) U.S. Cl.
CPC .............. *G02B 26/00* (2013.01); *B81B 3/0005* (2013.01); *B81B 7/0012* (2013.01); *B81B 7/0029* (2013.01); *B81C 1/0096* (2013.01); *G02B 26/02* (2013.01); *G02F 1/0102* (2013.01); *G09G 3/00* (2013.01); *B81B 2201/045* (2013.01); *G02B 27/0006* (2013.01)

(58) Field of Classification Search
CPC .... G02B 26/00; G02B 26/001; G02B 26/004; G02B 26/005; G02B 26/02; G02B 26/0808; G02B 26/0833; G02B 26/0841; G02B 26/357; G02B 26/3512; G02B 26/3534; G02B 26/3584; G02B 26/4226; G02B 2006/12104

USPC .......... 359/1, 9, 200.7, 225.1, 228, 237–240, 359/263, 290–296, 298, 319, 390, 484.04, 359/618, 666, 811, 819, 822, 824, 872

See application file for complete search history.

(56) References Cited

U.S. PATENT DOCUMENTS

| 7,417,782 B2 | 8/2008 | Hagood et al. |
| 7,839,356 B2 | 11/2010 | Hagood et al. |

(Continued)

FOREIGN PATENT DOCUMENTS

| CN | 1756990 A | 4/2006 |
| JP | H05127177 A | 5/1993 |

(Continued)

OTHER PUBLICATIONS

International Search Report and Written Opinion in International Application No. PCT/US2013/075278 dated Jun. 4, 2014.

(Continued)

*Primary Examiner* — Mahidere Sahle  
(74) *Attorney, Agent, or Firm* — Weaver Austin Villeneuve & Sampson, LLP

(57) ABSTRACT

This disclosure provides systems, methods and apparatus for preventing particles from entering electromechanical systems (EMS) display devices. In one aspect, an apparatus includes a plate, a substrate supporting at least one EMS device, a seal joining the plate and the substrate to define a cavity therebetween and at least one port for receiving a fluid, and a filter disposed between the port and the EMS device. The filter includes elements formed on at least one of a surface of the substrate and a surface of the plate, defining a gap sized to allow the received fluid to pass and to inhibit non-fluidic particles carried in the fluid from the EMS device.

24 Claims, 23 Drawing Sheets

(51) Int. Cl.
 B81B 7/00 (2006.01)
 B81C 1/00 (2006.01)
 G02B 26/02 (2006.01)
 G02B 27/00 (2006.01)

(56) References Cited

U.S. PATENT DOCUMENTS

| | | | |
|---|---|---|---|
| 8,498,639 B2 | 7/2013 | Chen et al. | |
| 8,743,446 B2 | 6/2014 | Okamoto et al. | |
| 2004/0036133 A1 | 2/2004 | Rodgers | |
| 2004/0036173 A1 | 2/2004 | Rodgers | |
| 2005/0194677 A1 | 9/2005 | Heschel et al. | |
| 2005/0219456 A1 | 10/2005 | Tadaki et al. | |
| 2006/0152474 A1 | 7/2006 | Saito et al. | |
| 2006/0250325 A1 | 11/2006 | Hagood et al. | |
| 2008/0037104 A1 | 2/2008 | Hagood et al. | |
| 2008/0174846 A1 | 7/2008 | Morozumi et al. | |
| 2008/0248613 A1* | 10/2008 | Chen et al. | 438/115 |
| 2010/0027100 A1 | 2/2010 | Lee et al. | |
| 2012/0307215 A1* | 12/2012 | Sano et al. | 355/30 |
| 2012/0307331 A1 | 12/2012 | Okamoto et al. | |

FOREIGN PATENT DOCUMENTS

| | | |
|---|---|---|
| JP | H11133446 A | 5/1999 |
| JP | 2001183683 A | 7/2001 |
| JP | 2005292347 A | 10/2005 |
| JP | 2008197668 A | 8/2008 |
| JP | 2009186666 A | 8/2009 |
| JP | 2009265463 A | 11/2009 |
| JP | 2010517072 A | 5/2010 |
| KR | 20070117599 A | 12/2007 |
| TW | 571160 | 1/2004 |
| TW | I224224 | 11/2004 |
| TW | I384774 | 2/2013 |
| WO | 2006091738 A1 | 8/2006 |
| WO | 2006091860 | 8/2006 |
| WO | WO-2008039919 A1 | 4/2008 |
| WO | 2008091339 A2 | 7/2008 |
| WO | 2008098223 A2 | 8/2008 |

OTHER PUBLICATIONS

Partial International Search Report—PCT/US2013/075278—ISA/EPO—Apr. 1, 2014.
European Search Report—EP12169402—Search Authority—Munich—Sep. 19, 2012.
European Search Report—EP14172440—Search Authority—Munich—Nov. 5, 2014.
Taiwan Search Report—TW101116398—TIPO—Oct. 9, 2014.

* cited by examiner

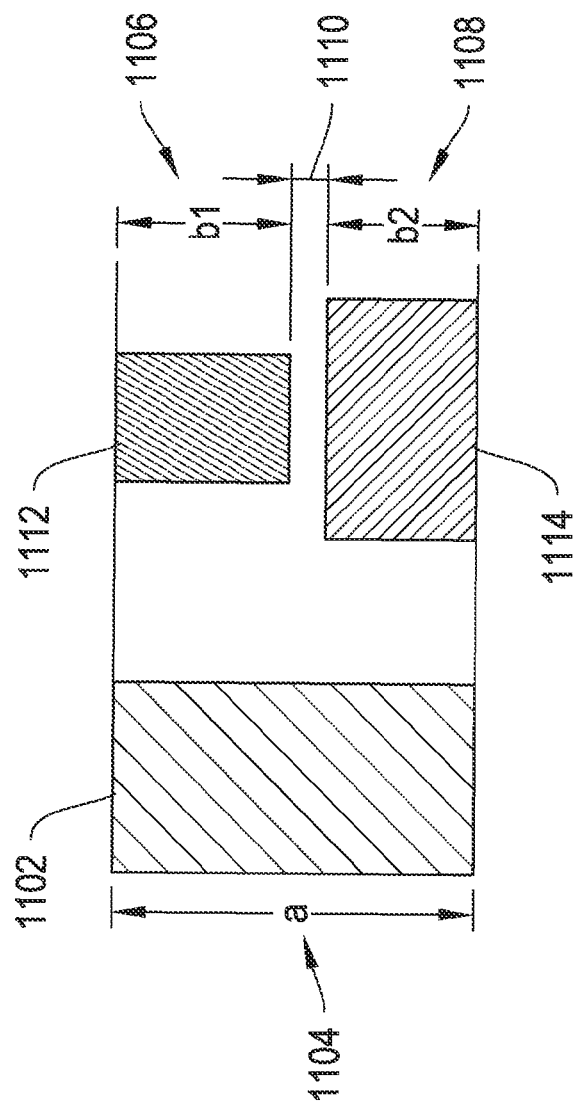
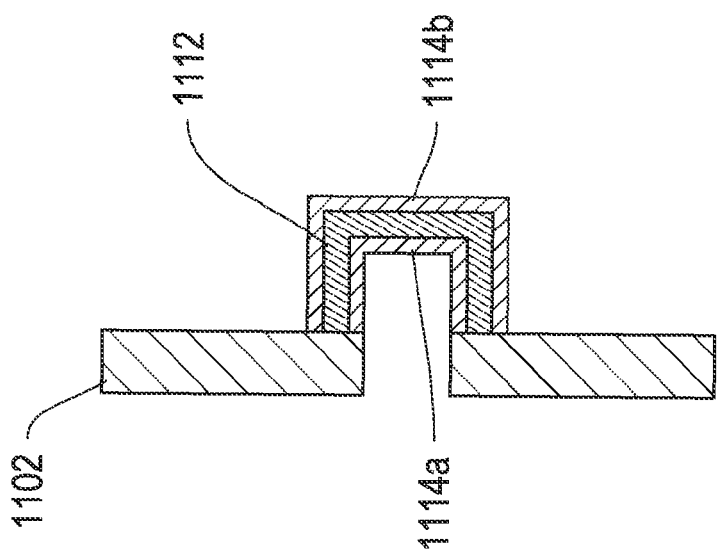
Figure 11B
Figure 11A

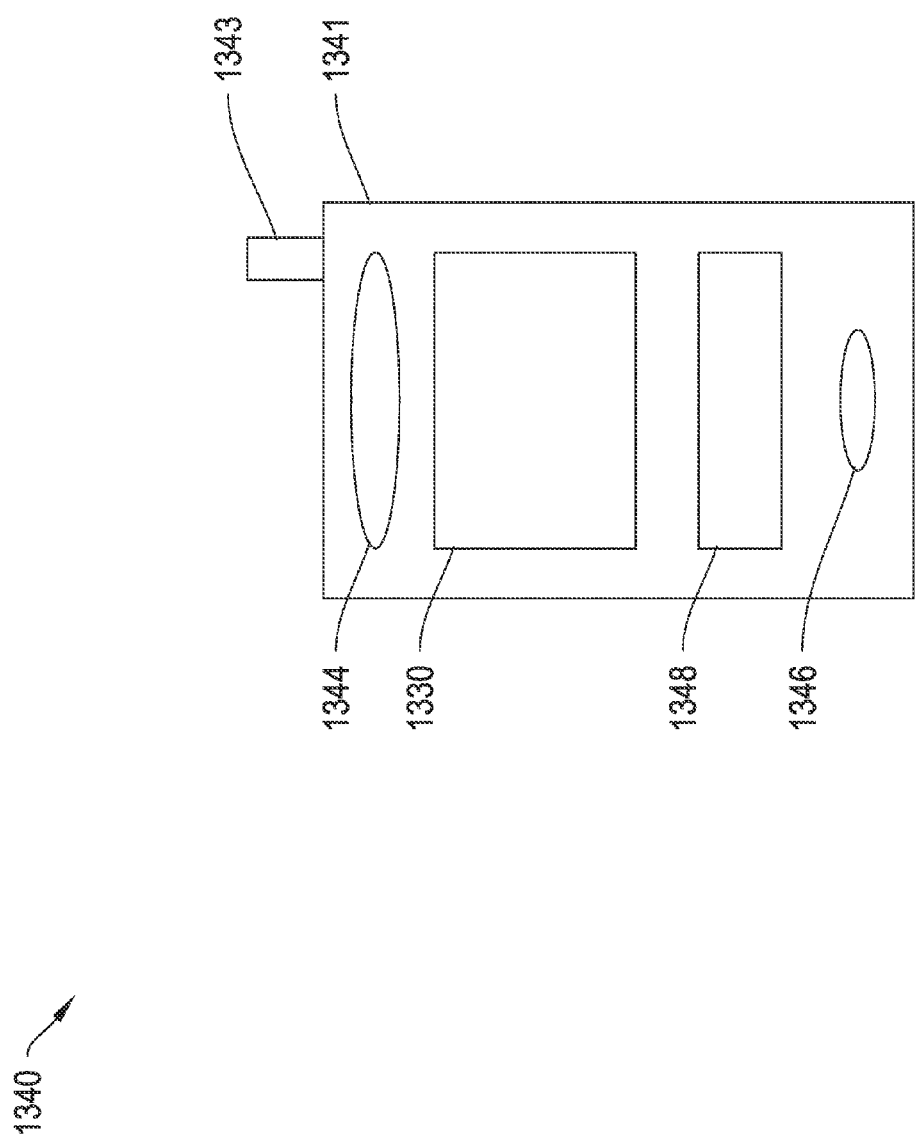

US 9,122,047 B2

PREVENTING GLASS PARTICLE INJECTION DURING THE OIL FILL PROCESS

TECHNICAL FIELD

This disclosure relates to electromechanical systems (EMS) and devices, and in particular, to preventing particles from entering EMS display devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

Devices that incorporate MEMS light modulators can include hundreds, thousands, or in some cases, millions of moving elements. When the moving elements in a device fail, the device eventually fails to function properly. One cause of failure of the moving elements is static friction. In some devices, every movement of an element provides an opportunity for static friction to disable one or more of the elements. This movement is facilitated, and static friction is reduced, by immersing all the parts in a working fluid (also referred to as fluid) and sealing the fluid within a fluid space or gap in a MEMS cell. The fluid is usually one with a low coefficient of friction, low viscosity, and minimal degradation effects over the long term. Identifying various causes of failure of the thousands or millions of moving elements, and decreasing the failure rate can increase device longevity.

Although this fluid can help reduce friction to increase longevity of the device, the fluid also can cause problems. For example, fluids that are dirty can introduce particles that lodge within moving parts of the device, in addition to other problems.

As such, there remains a need for systems and methods that improve the longevity of movable EMS devices.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus including a plate, a substrate supporting at least one electromechanical systems (EMS) device, a seal joining the plate and the substrate to define a cavity therebetween and at least one port for receiving a fluid, and a filter disposed between the port and the EMS device, and having elements formed on at least one of a surface of the substrate and a surface of the plate, defining a gap sized to allow the received fluid to pass and to inhibit non-fluidic particles carried in the fluid from the EMS device.

In some implementations, the elements can include a plurality of adjacent posts formed on the substrate and the posts are laterally spaced apart to provide the defined gap. In some implementations, the elements can include spacers integrally formed on at least one of the surface of the substrate and the surface of the plate to form a part of a barrier. The elements can include at least two walls spaced apart to form a channel to direct a flow of the received fluid against at least one wall.

In some implementations, the elements can include a first wall formed on the plate and a second wall formed on the substrate. A separation between the first wall and the second wall can define the gap. In some implementations, the elements include a first wall formed on the plate and a second wall formed on the substrate, and the first wall and the second wall form concentric walls, centered around the at least one port.

Another innovative aspect of the subject matter described in this disclosure can be implemented in a method of manufacturing a fluid-filled device, including providing a plate, providing a substrate wherein the substrate has an electromechanical systems (EMS) device, and wherein at least one of the plate and the substrate includes a filter, and the filter is formed by providing integrally formed filter elements on at least one of a surface of the substrate and a surface of the plate, and locating the filter elements proximate a peripheral edge of the substrate or the plate, and spacing the filter elements to define a gap sized to inhibit debris from passing through the filter elements. In some implementations, debris may include any non-fluidic particles.

In some implementations, forming the filter elements can include forming a plurality of posts on the substrate. In some implementations, forming the filter elements can include integrally forming spacers on the surface of the plate. The spacers contact at least one of the substrate and at least one spacer formed on the substrate. Forming the spacers can include forming at least two walls to form a channel having a turn for directing a flow of fluid against at least one of the two walls. In some implementations, forming the filter elements can include forming a first wall on the plate and forming a second wall on the substrate, and when the plate and the substrate are joined, the first wall and the second wall are disposed laterally adjacent to form a barrier.

Another innovative aspect of the subject matter of this disclosure can be implemented in an apparatus including a plate, a substrate supporting at least one electromechanical systems (EMS) device, formed thereon, a seal joining the plate and the substrate to define a cavity therebetween and at least one port for receiving a fluid into the cavity, and means for filtering the fluid injected into the cavity at the at least one port. The means for filtering is integrally formed on at least one of a surface of the substrate and a surface of the plate, and the means for filtering inhibits non-fluidic particles in the fluid from the at least one EMS device.

In some implementations, the means for filtering can include a plurality of adjacent posts formed on the substrate and laterally spaced apart to define a gap. In some implementations, the means for filtering can include spacers integrally formed on the surface of the plate to form a part of a barrier. In some implementations, the means for filtering can include at least two walls spaced apart to form a channel that directs a flow of the received fluid against at least one filtering wall. In some implementations, the means for filtering can include a first wall formed on the plate and a second wall formed on the substrate, and the first wall and the second wall are disposed laterally adjacent. In some implementations, the means for filtering can include a first wall formed on the plate and a second wall formed on the substrate, and the first wall and the second wall can form concentric ringed walls, centered around the at least one port.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays (LCDs), organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIG. 11A is an example of a filter including two types of filter elements.

FIG. 11B is a cross-sectional view of an example filter elements.

FIGS. 13A and 13B are example system block diagrams illustrating a display device that includes a plurality of light modulator display elements.

Like reference numbers and designations in the various drawings indicate like elements.

DETAILED DESCRIPTION

Figure 1A:
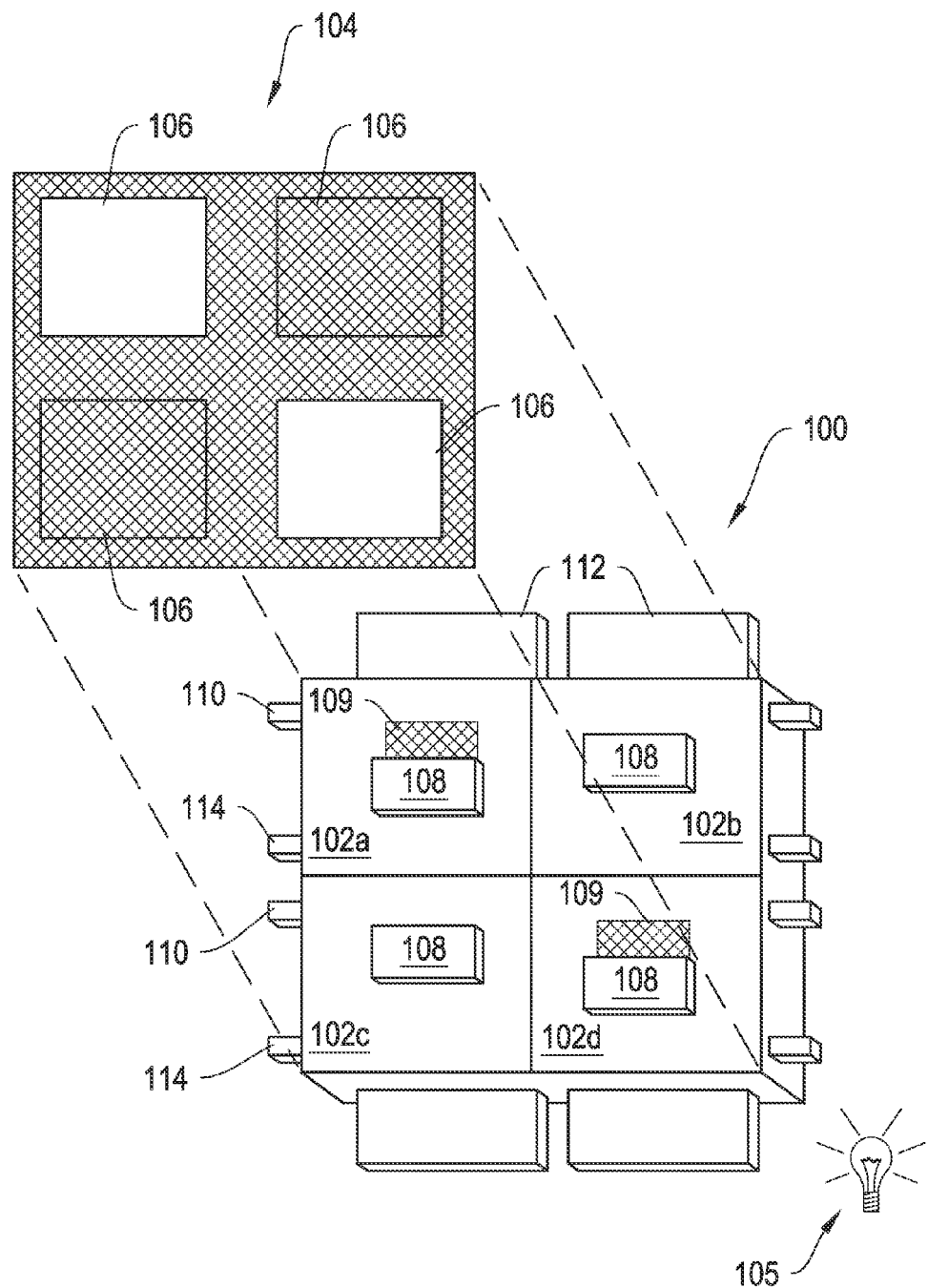
FIG. 1A is an isometric view of an example display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

This disclosure includes systems and methods provided to integrally form a filter to reduce the number of small non-fluidic particles that enter a display or other microfluidic device. For example, in some implementations the systems and methods are provided to filter non-fluidic particles having a width or diameter as small as about a micrometer. In some implementations, the systems provide an apparatus that may include a plurality of EMS devices. In some implementations, the EMS devices are surrounded by a fluid. To this end, the apparatus may include a substrate that supports the EMS devices and a plate may be placed over the substrate and sealed to the substrate to form a cavity. The plate can be joined to the substrate by a seal and the seal can include a port for receiving the fluid. The EMS devices can be housed within that cavity and the seal can provide a fluidtight chamber for the fluid that will surround the EMS devices. A filter may be disposed between the port and the EMS devices. The filter has elements that are integrally formed on the substrate or on the plate. The elements are closely spaced together so that the gap between adjacent elements is sufficiently small to trap particles that may be in the fluid, and will prevent the particles from being carried by the fluid to the EMS devices. In some implementations the elements are formed on the substrate, in some implementations the elements are formed on the plate and in some implementations the elements are formed on the substrate and on the plate.

Particular implementations of the subject matter described in this disclosure can be implemented to realize one or more of the following potential advantages. Reducing the number of non-fluidic particles in a display can decrease the number of moving elements that fail because of the presence of these debris particles. The debris can clog the moving elements, such as the EMS devices, and damage the apparatus.

In addition, the quality and reliability of displays that use light modulators, such as MEMS shutters or liquid crystals, can be increased by reducing the quantity of unwanted particles in the active areas of the display. In one example, a display includes a substrate and a transparent plate that can be sealed to the substrate and forms the viewing surface of the display. Fluid is injected at a fill port between the plate and the substrate, and one or more filter elements are formed near the fill port on one or both of the substrate and the transparent plate. The filter elements inhibit or block debris from entering the main section of the display which houses, for example, MEMS components or liquid crystals. By inhibiting or blocking the debris particles, the filter prevents the particles from clogging moving elements in the display, or adhering to the viewing surface of the display. The debris includes any non-fluidic particles.

Furthermore, filter elements can be added to displays that use light modulators, such as MEMS shutters or liquid crystals, without any adding fabrication steps to the process for building the display. In one example, filter elements are formed on the substrate during fabrication of the MEMS shutters. Avoiding additional fabrication steps minimizes any increase in fabrication costs and eliminates any potential decrease in fabrication efficiency.

FIG. 1A is an isometric view of an example display apparatus 100. The display apparatus 100 is a MEMS-based display and includes a plurality of light modulators 102a-102d (generally "light modulators 102") arranged in rows and columns. In the display apparatus 100, light modulators 102a and 102d are in the open state, allowing light to pass. Light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e. by use of a frontlight. In one of the closed or open states, the light modulators 102 interfere with light in an optical path by, for example, and without limitation, blocking, reflecting, absorbing, filtering, polarizing, diffracting, or otherwise altering a property or path of the light.

Display apparatus 100 is a direct-view display in that it does not require imaging optics. The user sees an image by looking directly at the display apparatus 100. In alternate implementations the display apparatus 100 is incorporated into a projection display. In such implementations, the display forms an image by projecting light onto a screen or onto a wall. In projection applications the display apparatus 100 is substantially smaller than the projected image 104.

Direct-view displays may operate in either a transmissive or reflective mode. In a transmissive display, the light modulators filter or selectively block light which originates from a lamp or lamps positioned behind the display. The light from the lamps is optionally injected into a light guide or "backlight". Transmissive direct-view display implementations are often built onto transparent or glass substrates to facilitate a sandwich assembly arrangement where one substrate, containing the light modulators, is positioned directly on top of the backlight.

Each light modulator 102 includes a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material.

The display apparatus also includes a control matrix connected to the substrate and to the light modulators for controlling the movement of the shutters. The control matrix includes a series of electrical interconnects (e.g., interconnects 110, 112, and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{we}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
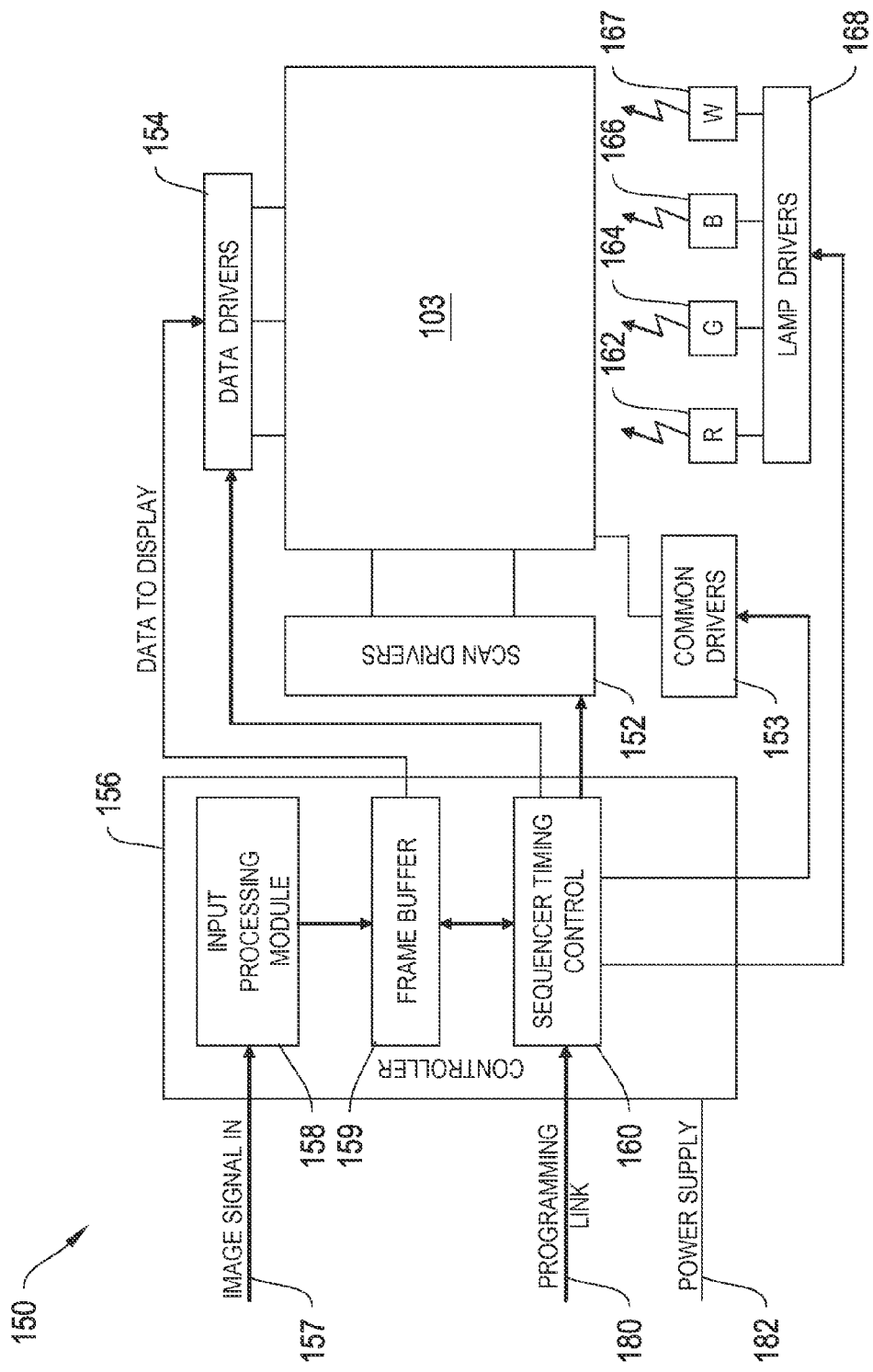
FIG. 1B is a block diagram of the display apparatus of FIG. 1A.

FIG. 1B is a block diagram 150 of the display apparatus 100 of FIG. 1A. Referring to FIGS. 1A and 1B, in addition to the elements of the display apparatus 100 described above, as depicted in the block diagram 150, the display apparatus 100 includes a plurality of scan drivers 152 (also referred to as "write enabling voltage sources") and a plurality of data drivers 154 (also referred to as "data voltage sources"). The scan drivers 152 apply write enabling voltages to scan-line interconnects 110. The data drivers 154 apply data voltages to the data interconnects 112.

The scan drivers 152 and the data drivers 154 are connected to digital controller circuit 156 (also referred to as the "controller 156"). The controller 156 includes an input processing module 158, which processes an incoming image signal 157 into a digital image format appropriate to the spatial addressing and the gray scale capabilities of the display 100. The ability to recreate the image turns, in part, on the light modulators 102 being able to pass and block light under the control of the controller 156. The pixel location and gray scale data of each image is stored in a frame buffer 159 so that the data can be fed out as needed to the data drivers 154. The data drivers will open and close the modulators 102 to create the image by spatially modulating light typically through the action of, in some implementations thousands or millions of light modulators. The failure of one or more of the light modulators 102 to open or close as instructed by the controller 156 will interfere with the ability of the display to create the image.

The display 100 apparatus optionally includes a set of common drivers 153, also referred to as common voltage sources. In some implementations the common drivers 153 provide a DC common potential to all light modulators within the array of light modulators 103, for instance by supplying voltage to a series of common interconnects 114. In some other implementations, the common drivers 153, following commands from the controller 156, issue voltage pulses or signals to the array of light modulators 103, for instance global actuation pulses which are capable of driving and/or initiating simultaneous actuation of all light modulators in multiple rows and columns of the array 103.

All of the drivers (such as the scan drivers 152, data drivers 154 and common drivers 153) for different display functions are time-synchronized by a timing-control module 160 in the controller 156. Timing commands from the module 160 coordinate the illumination of red, green and blue and white lamps (162, 164, 166 and 167 respectively) via lamp drivers 168, the write-enabling and sequencing of specific rows within the array of pixels 103, the output of voltages from the data drivers 154, and the output of voltages that provide for light modulator actuation.

The controller 156 determines the sequencing or addressing scheme by which each of the shutters 108 in the array 103 can be re-set to the illumination levels appropriate to a new image 104. New images 104 can be set at periodic intervals. For instance, for video displays, the color images 104 or frames of video are refreshed at frequencies ranging from 10 to 300 Hertz. In some implementations, the setting of an image frame to the array 103 is synchronized with the illumination of the lamps 162, 164 and 166 such that alternate image frames are illuminated with an alternating series of colors, such as red, green, and blue. The image frames for each respective color is referred to as a color sub-frame. In this method, referred to as the field sequential color method, if the color sub-frames are alternated at frequencies in excess of 20 Hz, the human brain will average the alternating frame images into the perception of an image having a broad and continuous range of colors.

The display 100 includes of a plurality of functional blocks including the timing control module 160, the frame buffer 159, scan drivers 152, data drivers 154, and drivers 153 and 168. Each block can be understood to represent either a distinguishable hardware circuit and/or a module of executable code. In some implementations, the functional blocks are provided as distinct chips or circuits connected together by means of circuit boards and/or cables. Alternately, many of these circuits can be fabricated along with the pixel array 103 on the same substrate of glass or plastic. In some other implementations, multiple circuits, drivers, processors, and/or control functions from block diagram 150 may be integrated together within a single silicon chip, which is then bonded directly to the transparent substrate holding pixel array 103.

The controller 156 includes a programming link 180 by which the addressing, color, and/or gray scale algorithms, which are implemented within controller 156, can be altered according to the needs of particular applications. The controller 156 also includes a power supply input 182 which provides the power needed for lamps as well as light modulator actuation.

Figure 2A:
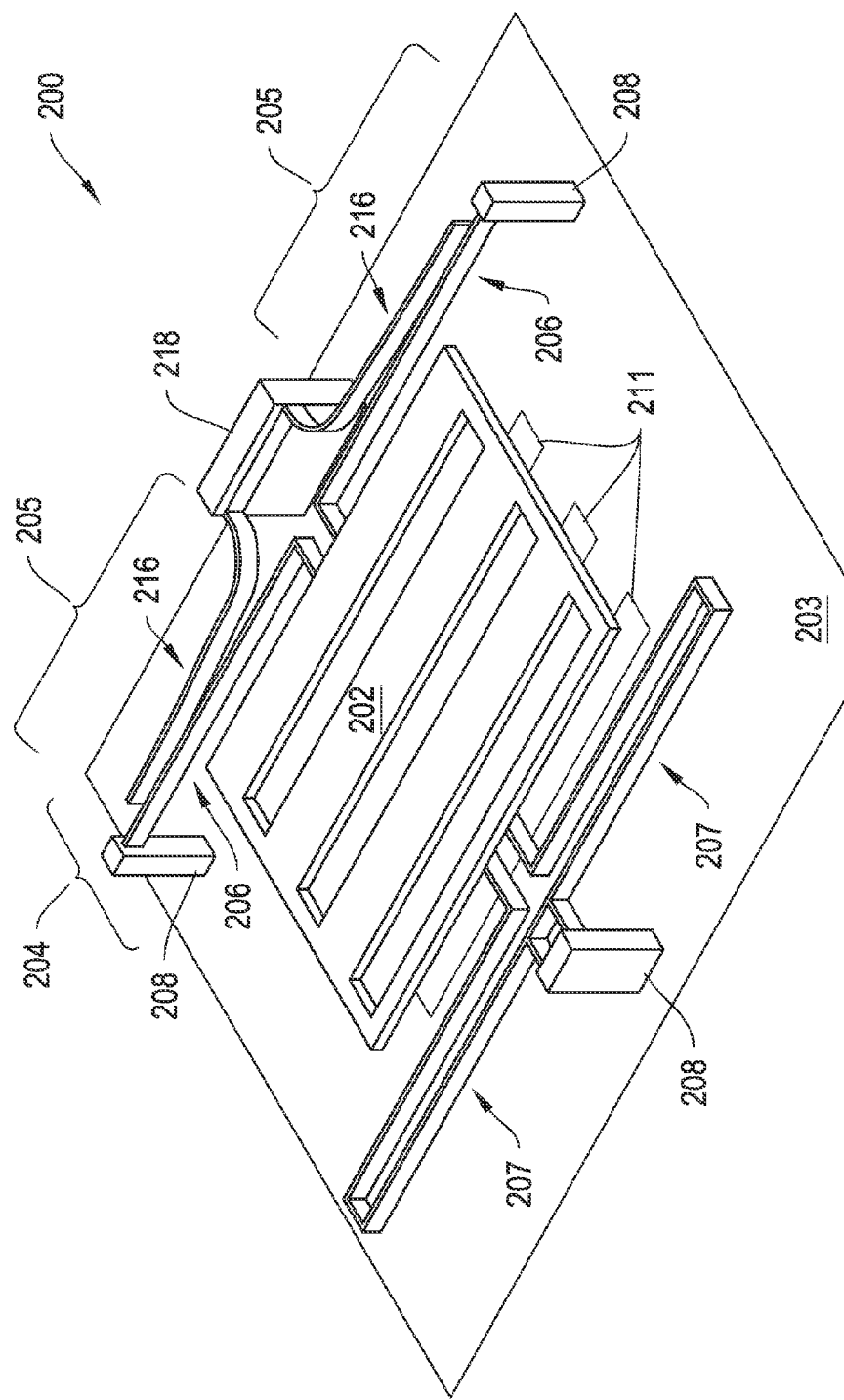
FIG. 2A is a perspective view of an illustrative shutter-based light modulator suitable for incorporation into the display apparatus of FIG. 1A.

FIG. 2A is a perspective view of an illustrative shutter-based light modulator suitable for incorporation into the MEMS-based display apparatus of FIG. 1A. The shutter-based light modulator 200 (also referred to as shutter assembly 200) includes a shutter 202 coupled to an actuator 204. The actuator 204 is formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The load anchors 208 physically connect the compliant load beams 206 and the shutter 202 to the surface 203 and electrically connect the load beams 206 to a bias voltage, in some instances, ground.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

The surface 203 includes one or more apertures 211 for admitting the passage of light. If the shutter assembly 200 is formed on an opaque substrate, made for example from silicon, then the surface 203 is a surface of the substrate, and the apertures 211 are formed by etching an array of holes through the substrate. If the shutter assembly 200 is formed on a transparent substrate, made for example of glass or plastic, then the surface 203 is a surface of a light blocking layer deposited on the substrate, and the apertures are formed by etching the surface 203 into an array of holes 211. The apertures 211 can be generally circular, elliptical, polygonal, serpentine, or irregular in shape.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 is removed, the load beams 206 push the shutter 202 back into its initial position, releasing the stress stored in the load beams 206.

The shutter assembly 200, also referred to as an elastic shutter assembly, incorporates a passive restoring force, such as a spring, for returning a shutter to its rest or relaxed position after voltages have been removed. A number of elastic restore mechanisms and various electrostatic couplings can be designed into or in conjunction with electrostatic actuators, the compliant beams illustrated in shutter assembly 200 being just one example.

The actuator 205 within the elastic shutter assembly is said to operate between a closed or actuated position and a relaxed position. The designer, however, can choose to place apertures 211 such that shutter assembly 200 is in either the "open" state, i.e., passing light, or in the "closed" state, i.e., blocking light, whenever actuator 205 is in its relaxed position. For illustrative purposes, it is assumed below that elastic shutter assemblies described herein are designed to be open in their relaxed state.

In many cases, a dual set of "open" and "closed" actuators may be provided as part of a shutter assembly so that the control electronics are capable of electrostatically driving the shutters into each of the open and closed states.

Figure 2B:
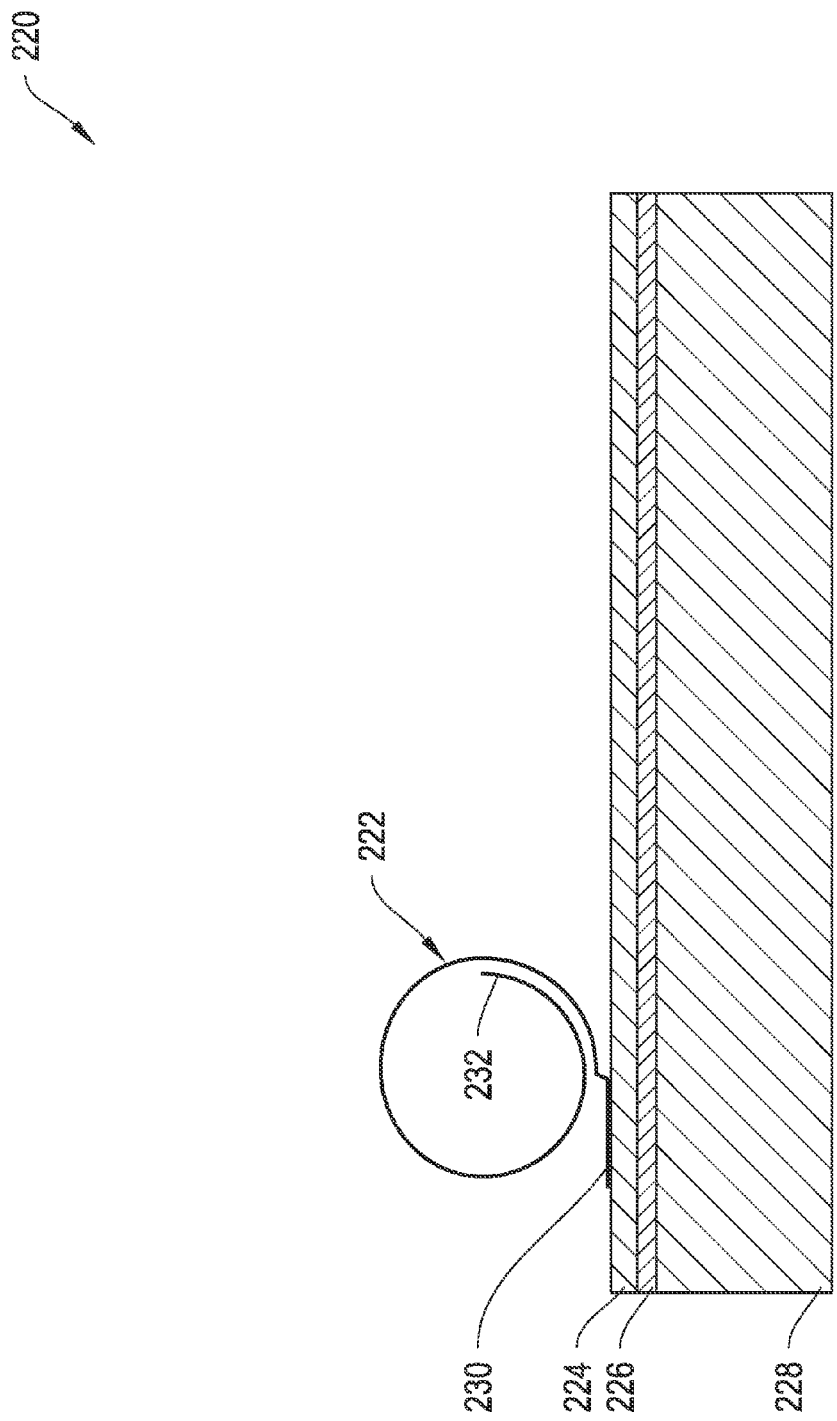
FIG. 2B is a cross-sectional view of a rollershade-based light modulator suitable for incorporation into the display apparatus of FIG. 1A.

Display apparatus 100, in alternative implementations, includes light modulators other than transverse shutter-based light modulators, such as the shutter assembly 200 described above. For example, FIG. 2B is a cross-sectional view of a rollershade-based light modulator suitable for incorporation into display apparatus of FIG. 1A. A rolling actuator-based light modulator includes a movable electrode disposed opposite a fixed electrode and biased to move in a particular direction to produce a shutter upon application of an electric field. In some implementations, the light modulator 220 includes a planar electrode 226 disposed between a substrate 228 and an insulating layer 224 and a movable electrode 222 having a fixed end 230 attached to the insulating layer 224. In the absence of any applied voltage, a movable end 232 of the movable electrode 222 is free to roll towards the fixed end 230 to produce a rolled state. Application of a voltage between the electrodes 222 and 226 causes the movable electrode 222 to unroll and lie flat against the insulating layer 224, whereby it acts as a shutter that blocks light traveling through the substrate 228. The movable electrode 222 returns to the rolled state by means of an elastic restoring force after the voltage is removed. The bias towards a rolled state may be achieved by manufacturing the movable electrode 222 to include an anisotropic stress state.

Figure 2C:
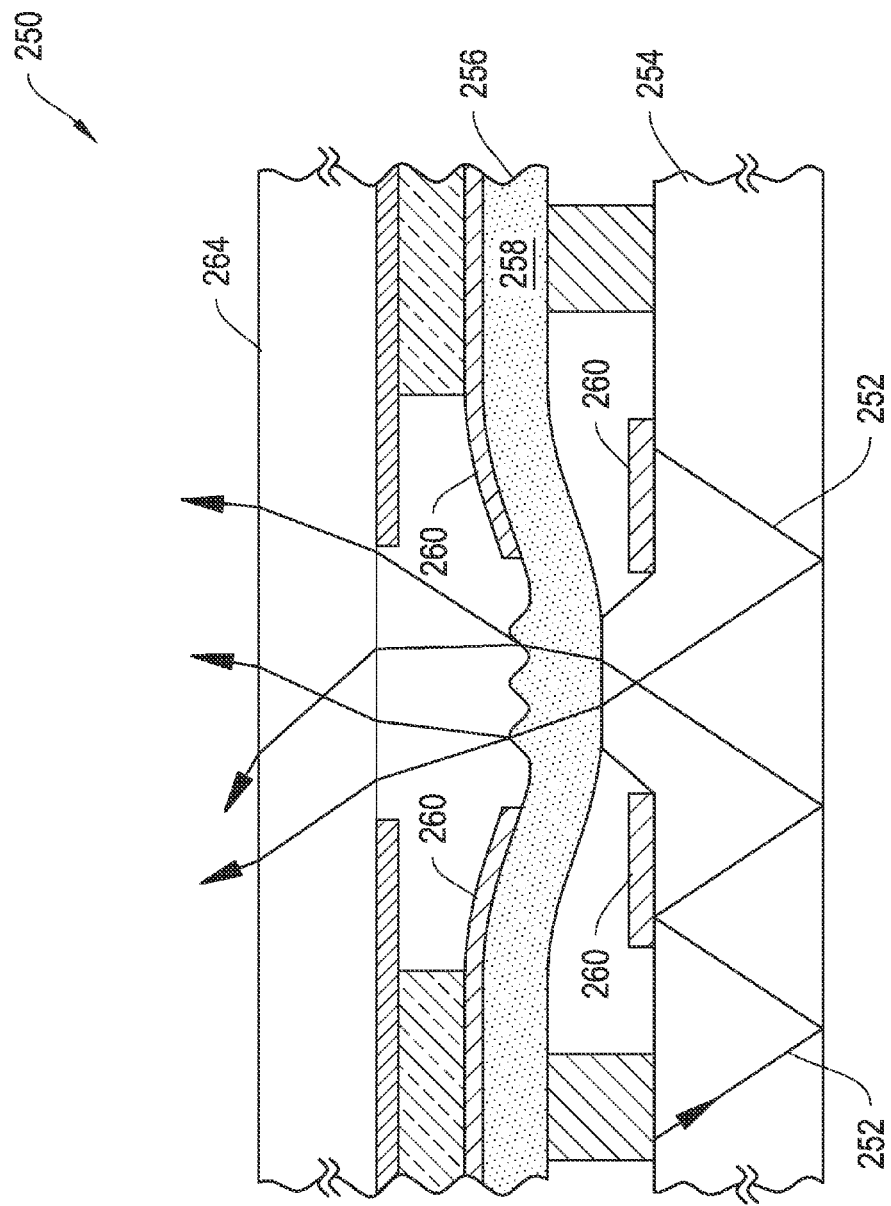
FIG. 2C is a cross sectional view of a light-tap-based light modulator suitable for incorporation into an alternative implementation of the display apparatus of FIG. 1A.

FIG. 2C is a cross-sectional view of a light-tap-based light modulator suitable for incorporation into display apparatus of FIG. 1A. A light tap works according to a principle of frustrated total internal reflection. That is, light 252 is introduced into a light guide 254, in which, without interference, light 252 is for the most part unable to escape the light guide 254 through its front or rear surfaces due to total internal reflection. The light tap 250 includes a tap element 256 that has a sufficiently high index of refraction that, in response to the tap element 256 contacting the light guide 254, light 252 impinging on the surface of the light guide 254 adjacent the tap element 256 escapes the light guide 254 through the tap element 256 towards a viewer, thereby contributing to the formation of an image.

In some configurations, the tap element 256 is formed as part of beam 258 of flexible, transparent material. Electrodes 260 coat portions of one side of the beam 258. Opposing electrodes 260 are disposed on the light guide 254. By applying a voltage across the electrodes 260, the position of the tap element 256 relative to the light guide 254 can be controlled to selectively extract light 252 from the light guide 254.

Figure 2D:
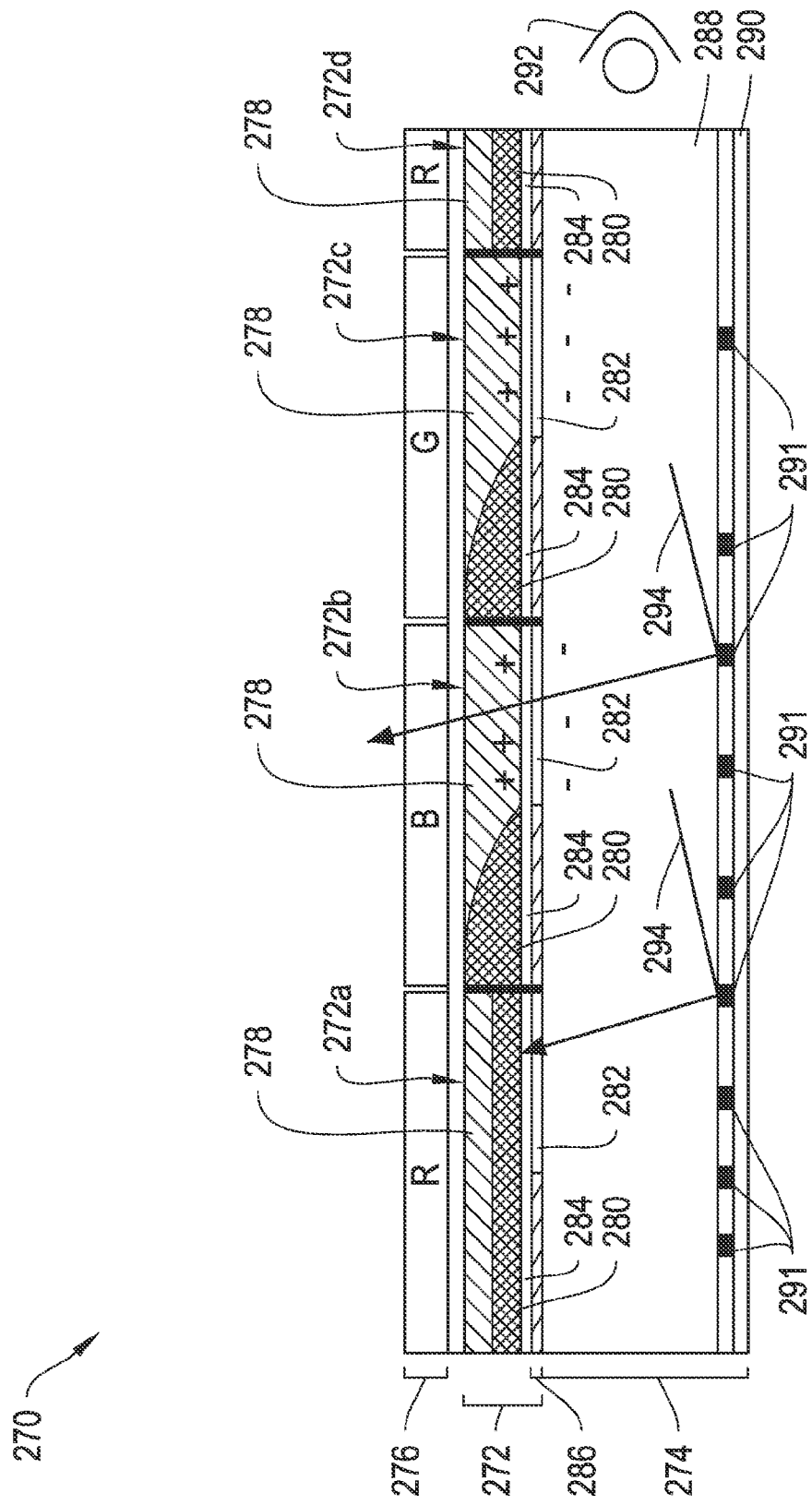
FIG. 2D is a cross sectional view of an electrowetting-based light modulator suitable for incorporation into an alternative implementation of the display apparatus of FIG. 1A.

FIG. 2D is a cross sectional view of an electrowetting-based light modulator suitable for incorporation into an alternative implementation of the display apparatus of FIG. 1A. The light modulation array 270 includes a plurality of electrowetting-based light modulation cells 272a-272d (generally "cells 272") formed on an optical cavity 274. The light modulation array 270 also includes a set of color filters 276 corresponding to the cells 272.

Each cell 272 includes a layer of water (or other transparent conductive or polar fluid) 278, a layer of light absorbing oil 280, a transparent electrode 282 (made, for example, from indium-tin oxide) and an insulating layer 284 positioned between the layer of light absorbing oil 280 and the transparent electrode 282.

In order to increase switching speed, at least one of the two liquid components 278 and 280 in the electrowetting display should have a low viscosity, optionally less than 70 centipoise or even less than 10 centipoise. Lower viscosities can be facilitated if at least one of the two liquid components includes materials having molecular weights less than 4000 grams/mole, or more particularly, less than 400 grams/mole. Suitable low viscosity fluids include water, alcohols, fluorinated silicone oils, polydimethylsiloxane, hexamethyldisiloxane, octamethyltrisiloxance, octane, and diethylbenzene.

Suitable working fluids include, without limitation, deionized water, methanol, ethanol and other alcohols, paraffins, olefins, ethers, silicone oils, fluorinated silicone oils, or other natural or synthetic solvents or lubricants. Useful working fluids can be polydimethylsiloxanes, such as hexamethyldisiloxane and octamethyltrisiloxane, or alkyl methyl siloxanes such as hexylpentamethyldisiloxane, or alkanes, such as octane or decane, or nitroalkanes, such as nitromethane, or aromatic compounds, such as toluene or diethylbenzene, or ketones, such as butanone or methyl isobutyl ketone, or chlorocarbons, such as chlorobenzene, or chlorofluorocarbons, such as dichlorofluoroethane or chlorotrifluoroethylene, or butyl acetate or dimethylformamide. The oils can be mixed with dyes to increase light absorption, either at specific colors such as cyan, magenta, and yellow, or over a broader spectrum to create a black ink.

For many implementations it is advantageous to incorporate a mixture of the above fluids. For instance mixtures of alkanes or mixtures of polydimethylsiloxanes can be useful where the mixture includes molecules with a range of molecular weights. It is also possible to optimize properties by mixing fluids from different families or fluids with different properties. For instance, the surface wetting properties of a hexamethyldisiloxane can be combined with the low viscosity of butanone to create an improved fluid.

The light modulation array 270 also includes a light guide 288 and one or more light sources 292 which inject light 294 into the light guide 288. A series of light redirectors 291 are formed on the rear surface of the light guide, proximate a front facing reflective layer 290. The light redirectors 291 may be either diffuse or specular reflectors. The modulation array 270 includes an aperture layer 286 which is patterned into a series of apertures, one aperture for each of the cells 272, to allow light rays 294 to pass through the cells 272 and toward the viewer.

In some configurations, the aperture layer 286 includes of a light absorbing material to block the passage of light except through the patterned apertures. In another implementation, the aperture layer 286 includes of a reflective material which reflects light not passing through the surface apertures back towards the rear of the light guide 288. After returning to the light guide, the reflected light can be further recycled by the front facing reflective layer 290.

In operation, application of a voltage to the electrode 282 of a cell causes the light absorbing oil 280 in the cell to move into or collect in one portion of the cell 272. As a result, the light absorbing oil 280 no longer obstructs the passage of light through the aperture formed in the reflective aperture layer 286 (see, for example, cells 272b and 272c). Light escaping the light guide 288 at the aperture is then able to escape through the cell and through a corresponding color (for example, red, green, or blue) filter in the set of color filters 276 to form a color pixel in an image. When the electrode 282 is grounded, the light absorbing oil 280 returns to its previous position (as in cell 272a) and covers the aperture in the reflective aperture layer 286, absorbing any light 294 attempting to pass through it.

The roller-based light modulator 220, light tap 250, and electrowetting-based light modulation array 270 are not the only examples of MEMS light modulators suitable for inclusion in various implementations described herein. It will be understood that other MEMS light modulators can exist and can be usefully incorporated into the implementations described herein.

Figure 3A:
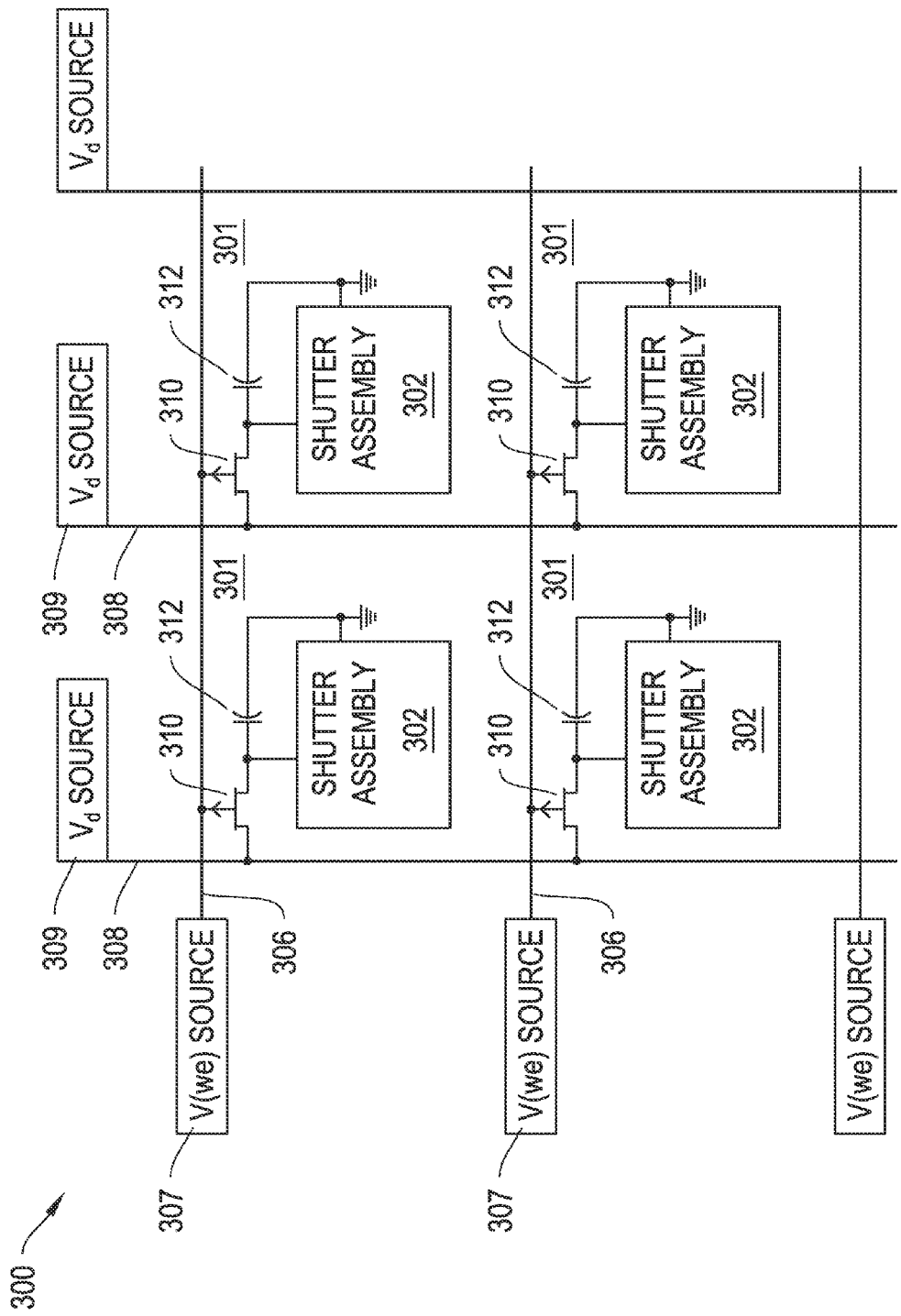
FIG. 3A is a schematic diagram of a control matrix suitable for controlling the light modulators incorporated into the display apparatus of FIG. 1A.
Figure 3B:
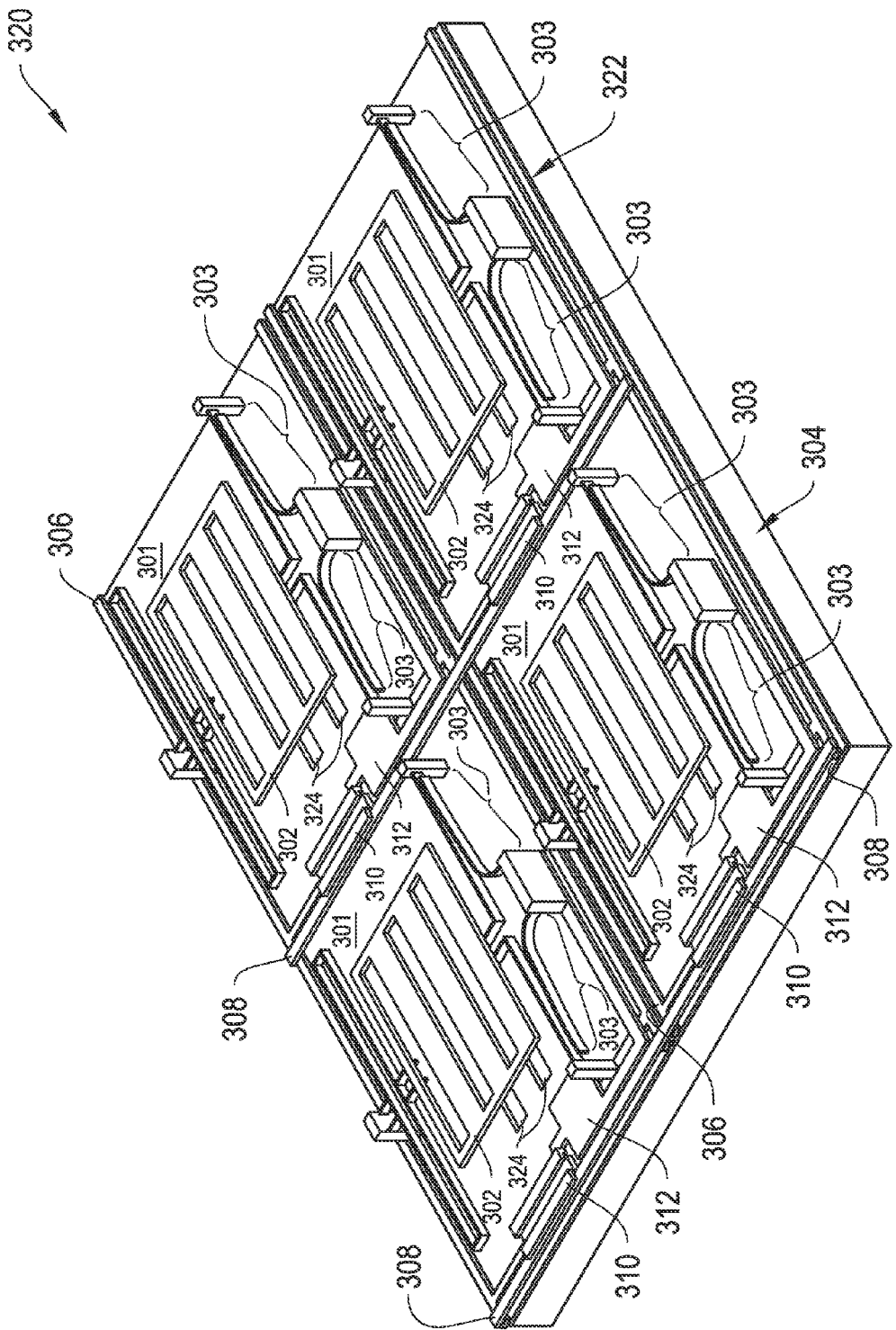
FIG. 3B is a perspective view of an example array of shutter-based light modulators connected to the control matrix of FIG. 3A.

FIG. 3A is a schematic diagram of a control matrix suitable for controlling the light modulators incorporated into the display apparatus of FIG. 1A. FIG. 3B is a perspective view of an example array of shutter-based light modulators connected to the control matrix of FIG. 3A. The control matrix 300 may address an array of pixels 320 (the "array 320"). Each pixel 301 includes an elastic shutter assembly 302, such as the shutter assembly 200 of FIG. 2A, controlled by an actuator 303. Each pixel also includes an aperture layer 322 that includes apertures 324.

The control matrix 300 may be fabricated as a diffused or thin-film-deposited electrical circuit on the surface of a substrate 304 on which the shutter assemblies 302 are formed. The control matrix 300 may include a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source, ("Vd source") 309 to the pixels 301 in a corresponding column of pixels 301. In control matrix 300, the data voltage $V_d$ provides the majority of the energy necessary for actuation of the shutter assemblies 302. Thus, the data voltage source 309 also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages $V_d$ are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed $V_{at}$ (the actuation threshold voltage). In response to the application of $V_{at}$ to a data interconnect 308, the actuator 303 in the corresponding shutter assembly 302 actuates, opening the shutter in that shutter assembly 302. The voltage applied to the data interconnect 308 remains stored in the capacitor 312 of the pixel 301 even after the control matrix 300 ceases to apply $V_{we}$ to a row. It is not necessary, therefore, to wait and hold the voltage $V_{we}$ on a row for times long enough for the shutter assembly 302 to actuate; such actuation can proceed after the write-enabling voltage has been removed from the row. The capacitors 312 also function as memory elements within the array 320, storing actuation instructions for periods as long as is necessary for the illumination of an image frame.

The pixels 301 as well as the control matrix 300 of the array 320 are formed on a substrate 304. The array includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic, or some other material that passes light in the visible spectrum. In another implementation the substrate 304 is made of an opaque material, but in which holes are etched to form the apertures 324.

Components of shutter assemblies 302 are processed either at the same time as the control matrix 300 or in subsequent processing steps on the same substrate. The electrical components in control matrix 300 are fabricated using many thin film techniques in common with the manufacture of thin film transistor arrays for liquid crystal displays. The shutter assemblies are fabricated using techniques similar to the art of micromachining or from the manufacture of micromechanical (i.e., MEMS) devices. For instance, the shutter assembly 302 can be formed from thin films of amorphous silicon, deposited by a chemical vapor deposition process.

The shutter assembly 302 together with the actuator 303 can be made bi-stable. That is, the shutters can exist in at least two equilibrium positions (e.g. open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as spring 207 in shutter-based light modulator 200, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

In some other implementations, a roller-based light modulator, a light tap, or electrowetting-based light modulation array, as well as other MEMS-based light modulators, can be substituted for the shutter assembly 302 within the light modulator array 320.

Figure 4A:
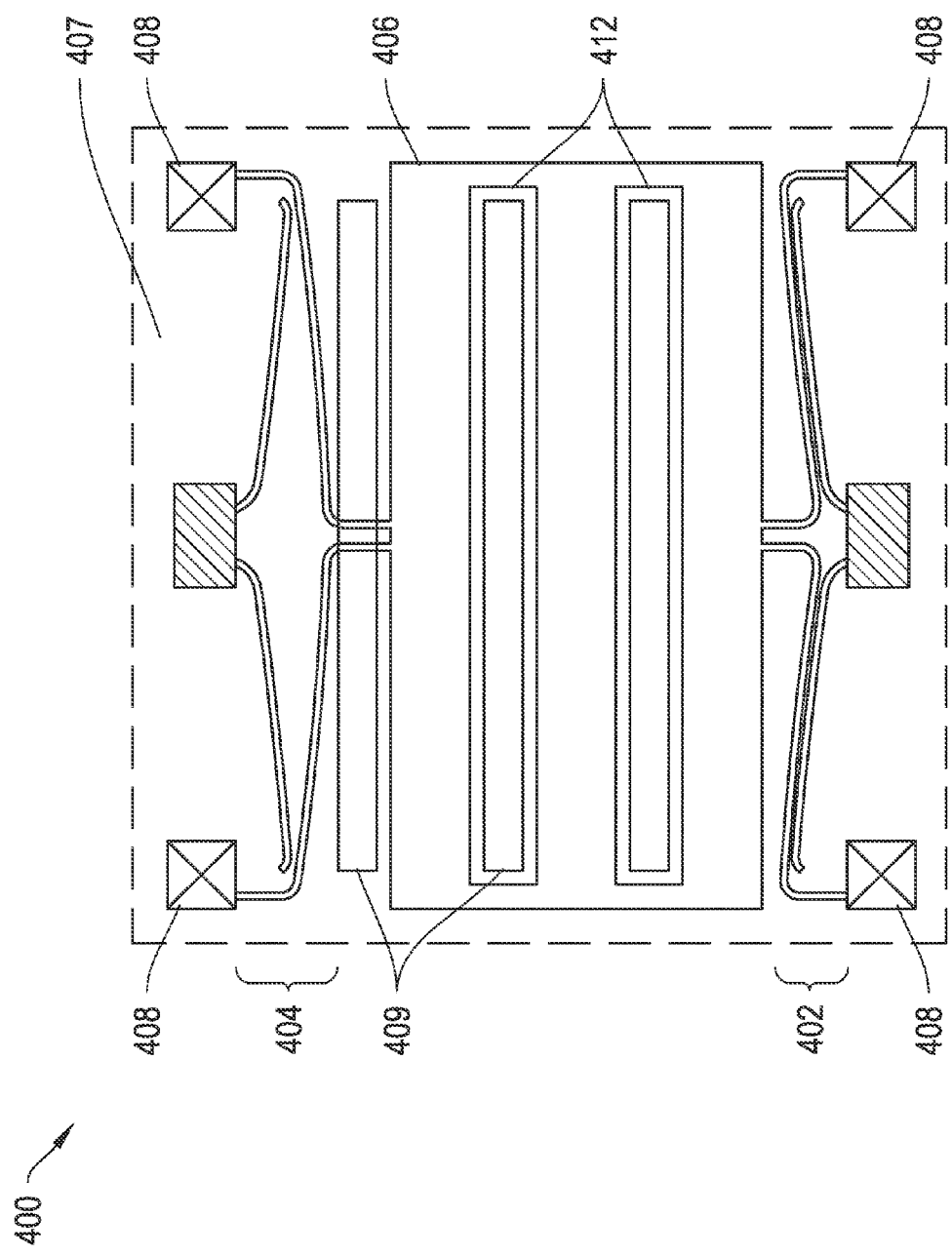
FIGS. 4A and 4B are plan views of an example dual-actuated shutter assembly in the open and closed states respectively.
Figure 4B:
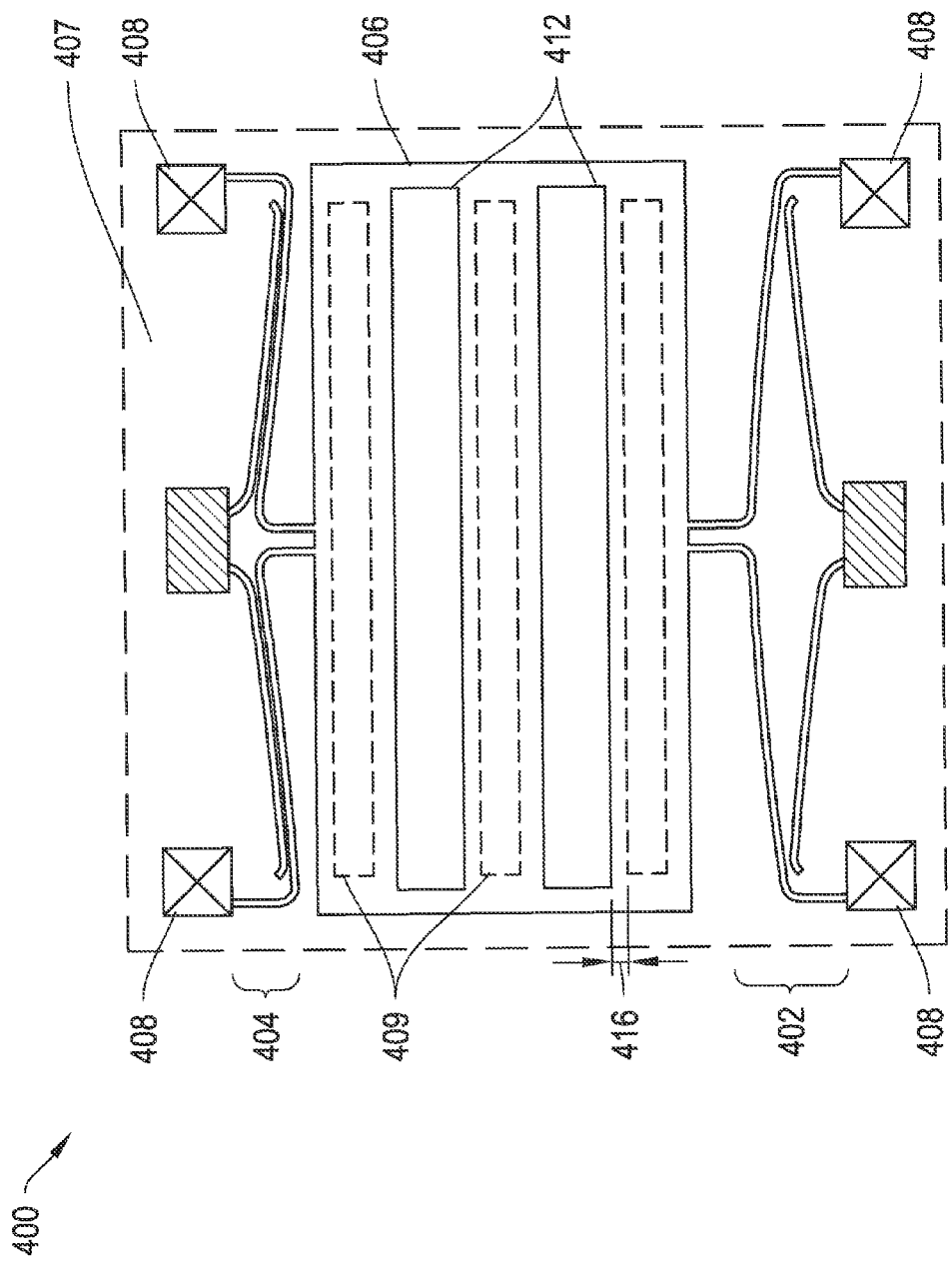

FIGS. 4A and 4B are plan views of an example dual-actuated shutter assembly in the open and closed states, respectively. The light modulator 400 is an example of a dual actuator shutter assembly, and is shown in FIG. 4A in an open state. FIG. 4B is a view of the dual actuator shutter assembly 400 in a closed state. In contrast to the shutter assembly 200, shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of apertures 412 and 409 coincide. In FIG. 4B the shutter assembly 400 has been moved to the closed state and, as such, the shutter-open actuator 402 is in its relaxed position, the shutter-close actuator 404 has been actuated, and the light blocking portions of shutter 406 are now in position to block transmission of light through the apertures 409 (shown as dotted lines).

Each aperture has at least one edge around its periphery. For example, the rectangular apertures 409 have four edges. In some implementations, in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, the light blocking portions of the shutter 406 may be arranged to overlap the apertures 409. FIG. 4B shows a predefined overlap 416 between the edge of light blocking portions in the shutter 406 and one edge of the aperture 409 formed in aperture layer 407.

The electrostatic actuators 402 and 404 are designed so that their voltage—displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$.

Figure 5:
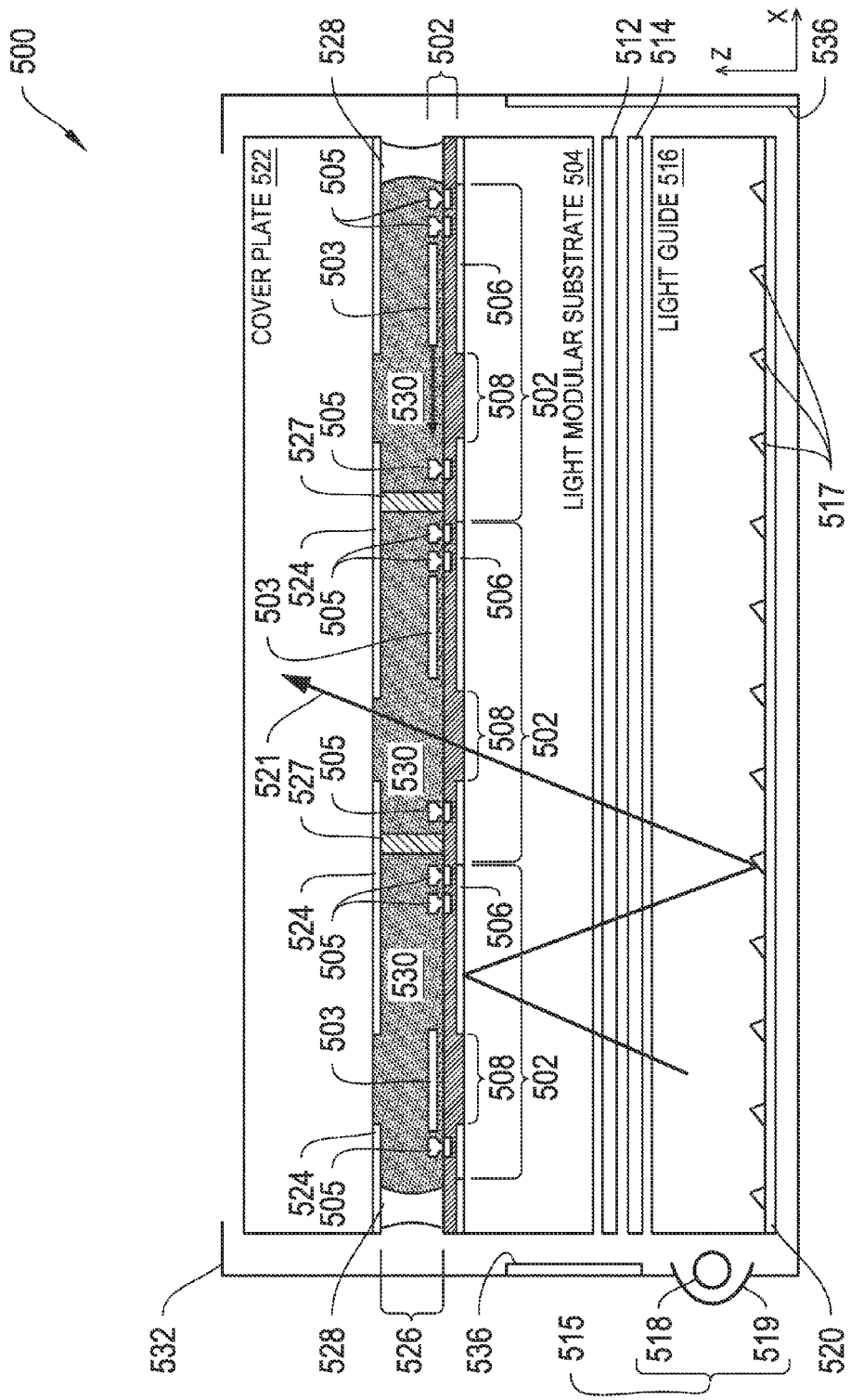
FIG. 5 is a cross-sectional view of an example shutter-based display apparatus.

FIG. 5 is a cross sectional view of an example shutter-based display apparatus. Each shutter assembly incorporates a shutter 503 and an anchor 505. Not shown are the compliant beam actuators which, when connected between the anchors 505 and the shutters 503, help to suspend the shutters a short distance above the surface. The shutter assemblies 502 are disposed on a transparent substrate 504, and may be made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition. In another implementation, the rear-facing reflective layer 506 can be formed from a mirror, such as a dielectric mirror. A dielectric mirror is fabricated as a stack of dielectric thin films which alternate between materials of high and low refractive index. The vertical gap which separates the shutters 503 from the reflective film 506, within which the shutter is free to move, is in the range of about 0.5 to 10 microns. The magnitude of the vertical gap may be less than the lateral overlap between the edge of shutters 503 and the edge of apertures 508 in the closed state, such as the overlap 416 shown in FIG. 4B.

The display apparatus 500 includes an optional diffuser 512 and/or an optional brightness enhancing film 514 which separate the substrate 504 from a planar light guide 516. The light guide includes a transparent, i.e., glass or plastic material. The light guide 516 is illuminated by one or more light sources 518, forming a backlight. The light sources 518 can be, for example, and without limitation, incandescent lamps, fluorescent lamps, lasers, or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light re-directors can be molded into the plastic body of light guide 516 with shapes that can be alternately triangular, trapezoidal, or curved in cross section. The density of the prisms 517 generally increases with distance from the lamp 518.

In alternate implementations, the aperture layer 506 can be made of a light absorbing material, and the surfaces of shutter 503 can be coated with either a light absorbing or a light reflecting material. In some implementations, the aperture layer 506 can be deposited directly on the surface of the light guide 516. In some other implementations, the aperture layer 506 need not be disposed on the same substrate as the shutters 503 and anchors 505 (see the MEMS-down configuration described below).

In some implementations, the light sources 518 can include lamps of different colors, for instance, the colors red, green, and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps or red, green, blue, and yellow lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a cavity 526. The cavity 526 is maintained by mechanical supports or spacers 527 and/or by an adhesive seal 528 attaching the cover plate 522 to the substrate 504.

A working fluid 530 is disposed in the cavity 526, and the adhesive seal 528 seals in the working fluid 530. The working fluid 530 is engineered with viscosities that may be below about 10 centipoise and with relative dielectric constant that may be above about 2.0, and dielectric breakdown strengths above about $10^4$ V/cm. The working fluid 530 also can serve as a lubricant. In some implementations, the working fluid 530 is a hydrophobic liquid with a high surface wetting capability. In some other implementations, the working fluid 530 has a refractive index that is either greater than or less than that of the substrate 504.

When the MEMS-based display assembly includes a liquid for the working fluid 530, the liquid at least partially surrounds the moving parts of the MEMS-based light modulator. In order to reduce the actuation voltages, the liquid has a viscosity that may be below 70 centipoise, or even below 10 centipoise. Liquids with viscosities below 70 centipoise can include materials with low molecular weights: below 4000 grams/mole, or in some cases below 400 grams/mole. Suitable working fluids 530 include, without limitation, de-ionized water, methanol, ethanol and other alcohols, paraffins, olefins, ethers, silicone oils, fluorinated silicone oils, or other natural or synthetic solvents or lubricants, or any of the low viscosity fluids discussed above. For many implementations, it is advantageous to incorporate a mixture of the above fluids.

In some implementations, a sheet metal or molded plastic assembly bracket 532 holds the cover plate 522, the substrate 504, the backlight 516 and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of light guide 516 back into the light guide. Not shown in FIG. 5 are electrical interconnects which provide control signals as well as power to the shutter assemblies 502 and the lamps 518.

In some other implementations, a roller-based light modulator, a light tap, or an electrowetting-based light modulation array, as well as other MEMS-based light modulators, can be substituted for the shutter assemblies 502 within the display assembly 500.

The display apparatus 500 is referred to as the MEMS-up configuration, where the MEMS based light modulators are formed on a front surface of substrate 504, i.e. the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in display apparatus 500 and is oriented such that the MEMS-based light modulators are positioned on the rear surface of the top substrate, i.e. the surface that faces away from the viewer and toward the back light 516. The MEMS-based light modulators are thereby positioned directly opposite to and across a gap from the reflective aperture layer. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures may be less than 10 microns, or a distance that is less than the overlap between shutters and apertures, such as overlap 416.

Systems and methods are provided to reduce non-fluidic particles from entering a display or other microfluidic device during a fluid fill process by including a filter near the fluid fill port. In one example, a display includes a substrate and a plate that are joined together, and the fluid is injected into a cavity between the substrate and the plate at the fill port. Multiple filter elements can be located near the fill port on one or both of the substrate and the plate. In some implementations, the filter elements can be integrally formed near the fill port. The filter elements inhibit or block debris, reducing the number of non-fluidic particles that enter the main section of the display which houses the electromechanical systems (EMS) or liquid crystals.

Figure 6:
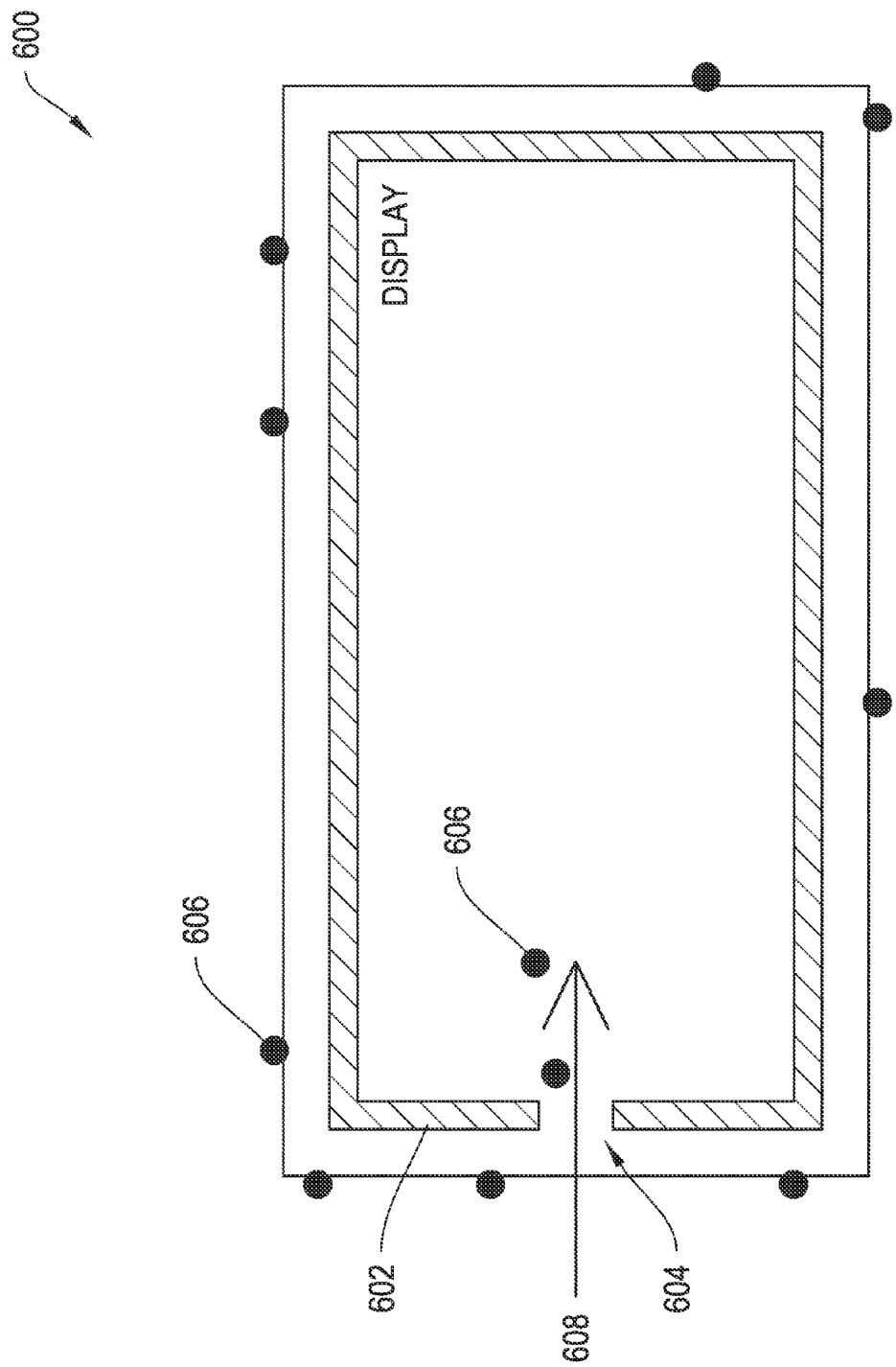
FIG. 6 depicts an example display including a seal and a fluid fill port.

FIG. 6 depicts an example display including a seal and a fluid fill port. Non-fluidic particles 606 may be present around the edges of the display 600, or just outside the seal of the display. The non-fluidic particles 606 are debris, and may include glass particle debris created when the glass display was diced, grinded, or cut to size. The non-fluidic particles may include debris from general handling of the parts of the display 600 or debris from the ambient environment. Additionally, some non-fluidic particles may be present in the fluid before it is used to fill the display. The portion of display 600 depicted in FIG. 6 has one fill port 604, however, the display 600 may have more than one fill port and the number, size and location of fill ports used will vary according to the fill process and the characteristics of the display 600. As shown in FIG. 6, when fluid 608 is introduced into the display at the oil fill port 604, some non-fluidic particles 606 also may be introduced into the display.

In some implementations, the display 600 includes a substrate and a plate, such as a glass or plastic plate. The substrate may include one or more EMS components. The EMS components may include one or more MEMS components. In some implementations, EMS components are MEMS shutter assemblies, such as the shutter assemblies 302 depicted in FIG. 3. As discussed above, the display 600 may have hundreds or thousands of shutter assemblies 302 or other EMS components, and these EMS components may be operating within a sealed and fluid filled environment. The EMS components may be integrally formed on the substrate, for example, by machining or etching the substrate to add or remove material, thereby forming EMS components. In another implementation, EMS components reside on the substrate. Examples of EMS components include shutters, rolling shutters, light tap modulators, mirrors, and other microfluidic components.

The substrate and the plate are joined together with the seal 602, thereby defining a cavity between the substrate and the plate. In various implementations, the seal may be an epoxy seal, an epoxy resin, or a glass frit material. In addition, the seal may define one or more fill port holes to allow injection of fluid into the cavity. The cavity is the space between the substrate and the plate, and is outlined by the seal. A small portion of the seal is initially left open to provide a port through which fluid can enter the cavity. After the cavity is substantially filled with fluid, the port is sealed, preventing fluid from leaking out of the cavity through the port. The fill port hole is sealed with a sealant that can be cured by one or more of ultraviolet light and exposure to a temperature that is less than the boiling point of the fluid in the cavity. In some implementations, the fluid is an oil. As shown in FIG. 6, the fluid is introduced into the cavity at the fill port hole 604. The fluid may contact one or more debris particles 606, carrying the debris particles into the display 600. The debris particles 606 can clog the MEMS components and damage the display 600.

Figure 7:
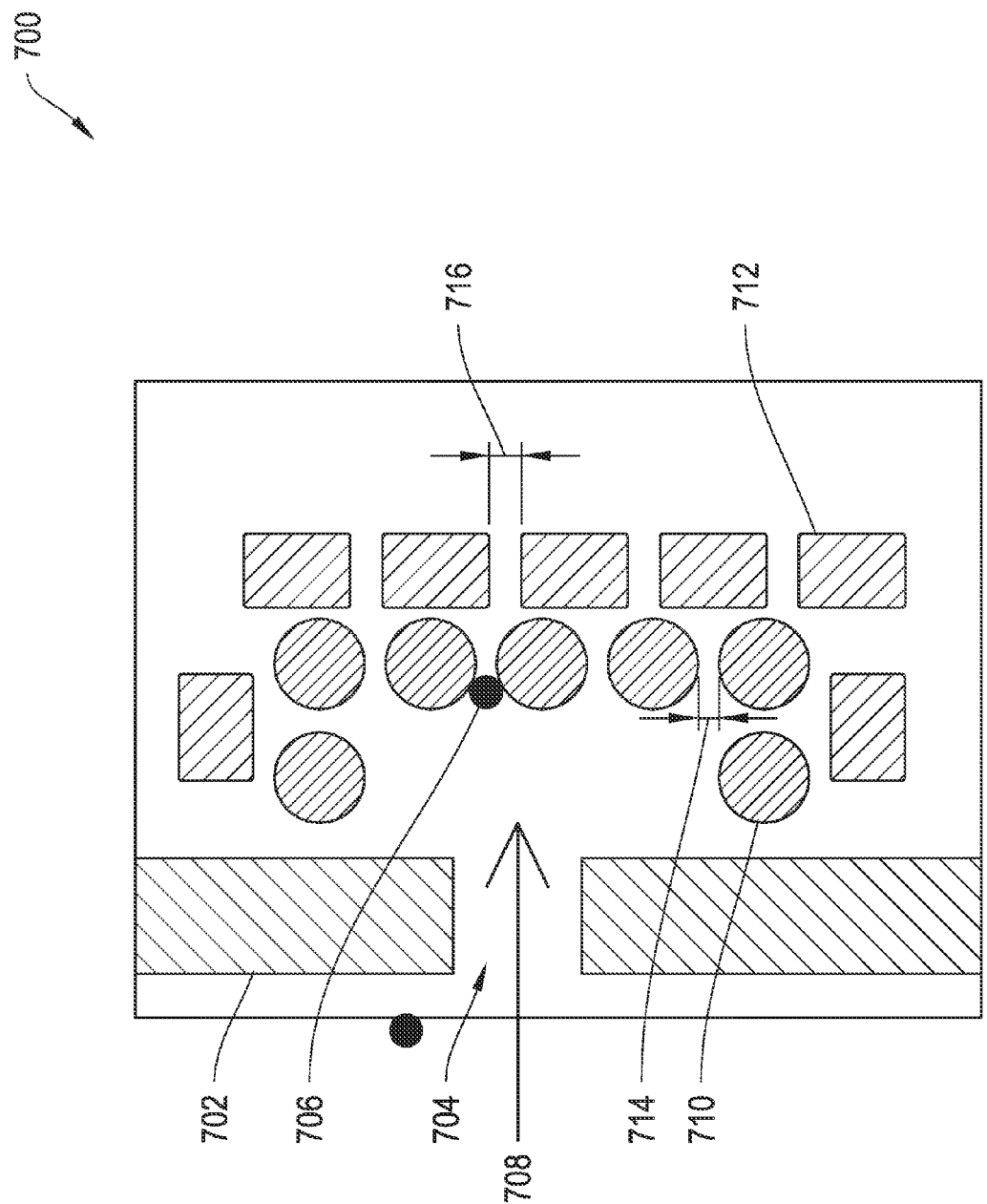
FIG. 7 depicts an example of a filter including two types of filter elements.

FIG. 7 depicts an example of a filter including two types of filter elements. The portion of the display 700 shown in FIG. 7 includes a seal 702, a fill port 704, and first 710 and second 712 filter elements. Fluid 708 is injected into the display at the fill port 704. The filter is positioned inside the display near the fill port 704, to inhibit non-fluidic particles 706 as they enter the display 700 and before the non-fluidic particles 706 reach EMS components inside the main body of the display 700. In some implementations, the filter may include one or more filter elements, such as posts, columns, bumps or other protrusions. The filter elements are integrally formed on at least one of the substrate and the plate of the display, and may be formed of the same material as the substrate or the plate. The filter elements may include aperture plate spacers or bumps and MEMS landing areas. In one example, the first filter elements 710 are aperture plate spacers and the second filter elements 712 are landing areas. Landing areas may be coated with a beams layer, similar to the beams layer used to coat landing areas in the active area of the display. The landing areas used for the filter and in the active area of the display can be built at the same time. The filter elements may be constructed of materials having good adhesion. In various implementations, the filter elements may be formed of glass, silicon, a material including a photopolymer, silicon, a silicate, silicate glass, or another type of glass.

In some alternative implementations, the filter is integrally formed entirely, or substantially entirely, on the substrate, and the first and second filter elements are formed of a photodefinable photopolymer. In some implementations, the first filter elements 710 are formed of the same materials as the second filter elements 712, and in other implementations, the first filter elements are formed of a different material from the second filter elements. The filter elements on the substrate may be formed in the same manner as the filter elements on the plate. In some implementations, one or more of the first and second filter elements are beam layer encapsulated mold resist, and according to one feature, encapsulated filter elements do not ash away during release. Ashing is the term used for the plasma process that removes or ashes away certain organic materials. Release is the removal of the sacrificial polymer layer leaving the MEMS structure behind. In some implementations, if the polymer layer is completely coated with a beams layer or some material that does not ash, then it will remain encapsulated and add mechanical strength to the structure. In some implementations, the first and second filter elements are variously formed from a combination of materials.

In some implementations, when fluid is injected into the display, non-fluidic particles may attach to the filter elements 710 and 712, reducing the number of non-fluidic particles 706 that reach EMS components inside the main body of the display 700. In another implementation, the filter elements form a barrier to non-fluidic particles too large to pass through gaps between filter elements 710 and 712, and the non-fluidic particles are inhibited from passing through the filter into the display.

The filter includes first filter elements 710 and second filter elements 712. The first 710 and second 712 filter elements may be spacers. The first 710 and second 712 filter elements are disposed in a pattern that surrounds the fill port 704 in the display. The first filter elements 710 are disposed inside the second filter elements 712, closer to the fill port 704. In some implementations, the first filter elements 710 are formed on the substrate of the display 700, and extend from the substrate to the plate of the display 700. In some implementations, the first filter elements 710 can be integrally formed on the substrate. In other implementations, the first filter elements 710 are formed on the plate and extend from the plate to the substrate. In some implementations, the first filter elements 710 can be integrally formed on the plate. In some implementations, the first filter elements 710 extend a distance from the substrate but do not abut the plate, or extend a distance from the plate but do not abut the substrate. First gaps 714 between the first filter elements 710 allow fluid to pass between them. However, non-fluidic particles 706 are blocked from passing between the first filter elements 710. In some implementations, the first gaps 710 are less than about one micrometer wide. According to one feature, once a non-fluidic particle is inhibited by a first filter element 710 or a second filter element 712, the particle remains in place at the first 710 or second 712 filter element, substantially permanently.

The second filter elements 712 are shown disposed adjacent the first filter elements 710, and provide an additional barrier to non-fluidic particles that may pass through the gaps 714. In some implementations, the second filter elements 712 are formed on the substrate of the display 700, and extend from the substrate to the plate of the display 700. In some implementations, the second filter elements 712 can be integrally formed on the substrate. In some other implementations, the second filter elements 712 are formed on the plate and extend from the plate to the substrate. In some implementations, the second filter elements 712 can be integrally formed on the plate. In some implementations, the second filter elements 712 extend a distance from the substrate but do not abut the plate, or extend a distance from the plate but do not abut the substrate. The second gaps 716 between the second filter elements 712 allow fluid to pass between them. However, non-fluidic particles 706 are inhibited from passing between the second filter elements 712. In some implementations, the second gaps 716 are less than about five (5), four (4), three (3), two (2), or one (1) micrometer wide.

In some implementations, the first filter elements 710 are formed on the substrate, and the second filter elements 712 are formed on the plate. In some implementations, the first filter elements 710 are integrally formed on the substrate, and the second filter elements 712 are integrally formed on the plate. In some implementations, the plate is the aperture plate. The first 710 and second 712 filter elements may extend the depth of the cavity to abut the opposing side (i.e., the substrate or the plate) of the display, or they may only extend part of the distance toward the opposing side of the display. There may be a space or gap between the first filter elements and the second filter elements. In some implementations, the gap is at most about one micrometer. In another implementation, the first filter elements 710 are formed on the plate, and the second filter elements 712 are formed on the substrate. In some implementations, the first filter elements 710 are integrally formed on the plate, and the second filter elements 712 are integrally formed on the substrate.

As shown in FIG. 7, the first filter elements 710 are cylindrical and the second filter elements 712 are substantially rectangular. In various implementations, one or more of the first filter elements 710 and the second filter elements 712 may be oval-shaped, cube-shaped, triangular, pyramid-shaped, cylindrical, rectangular, or any other shape. In some implementations, one or more of the first filter elements 710 and the second filter elements 712 may have multiple sides, resulting in the top view having a polygon shape, such as pentagon, hexagon, heptagon, or octagon. In some implementations, one or more of the first filter elements 710 has a different shape from other first filter elements 710, and each of the first filter elements 710 may have a different shape. In some implementations, one or more of the second filter elements 712 has a different shape from other second filter elements 712, and each of the second filter elements 712 may have a different shape.

Figure 8A:
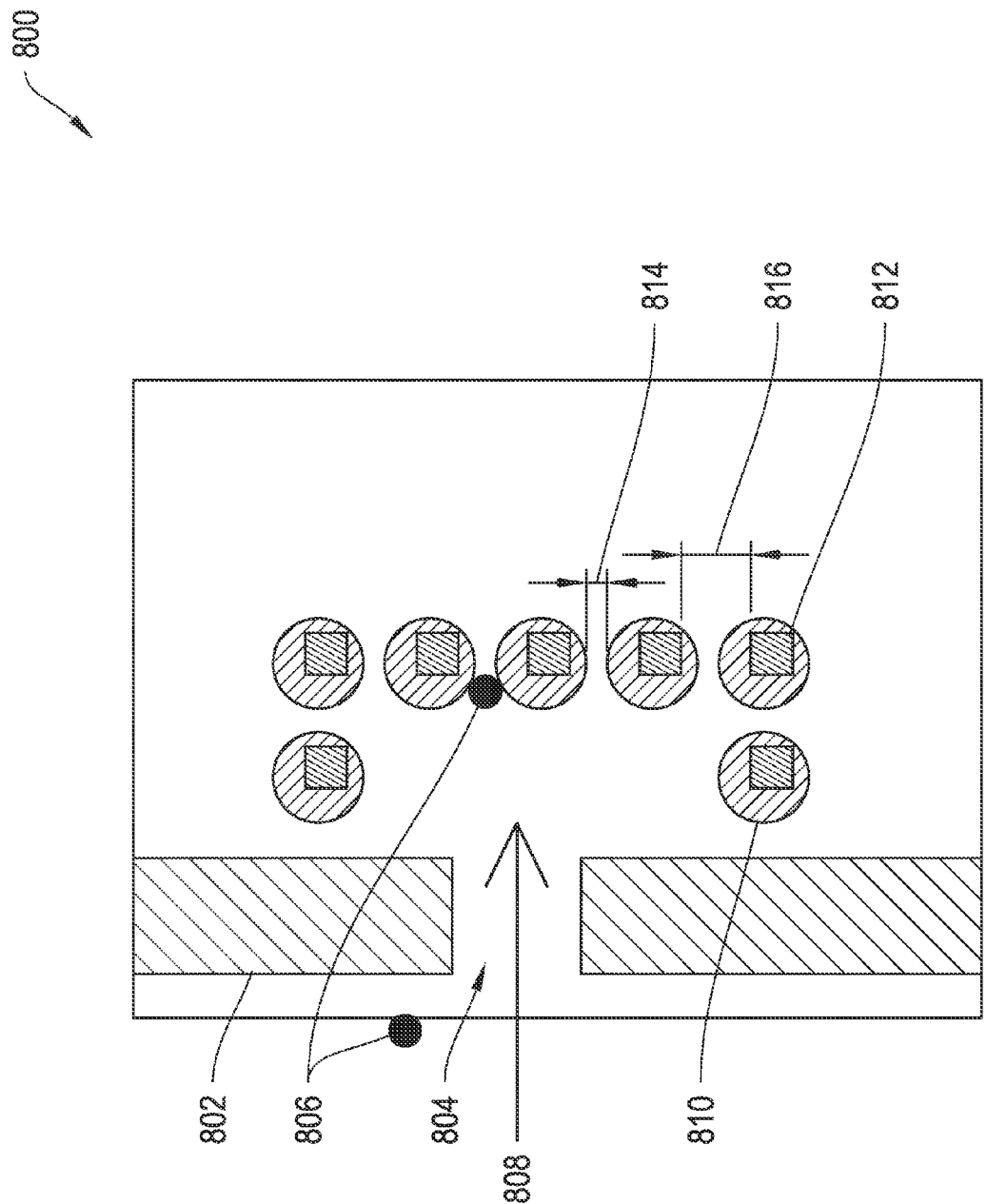
FIG. 8A depicts an example of a filter including two types of filter elements.

FIG. 8A depicts an example of a filter including two types of filter elements. The portion of a display 800 shown in FIG. 8A includes a seal 802, a fill port 804, and first 810 and second 812 filter elements. The fluid 808 is injected into the display at the fill port 804. The filter is positioned inside the display near the fill port 804, to block or inhibit non-fluidic particles 806 as they enter the display 800 and before the non-fluidic particles 806 reach electromechanical components inside the main body of the display 800.

Figure 8B:
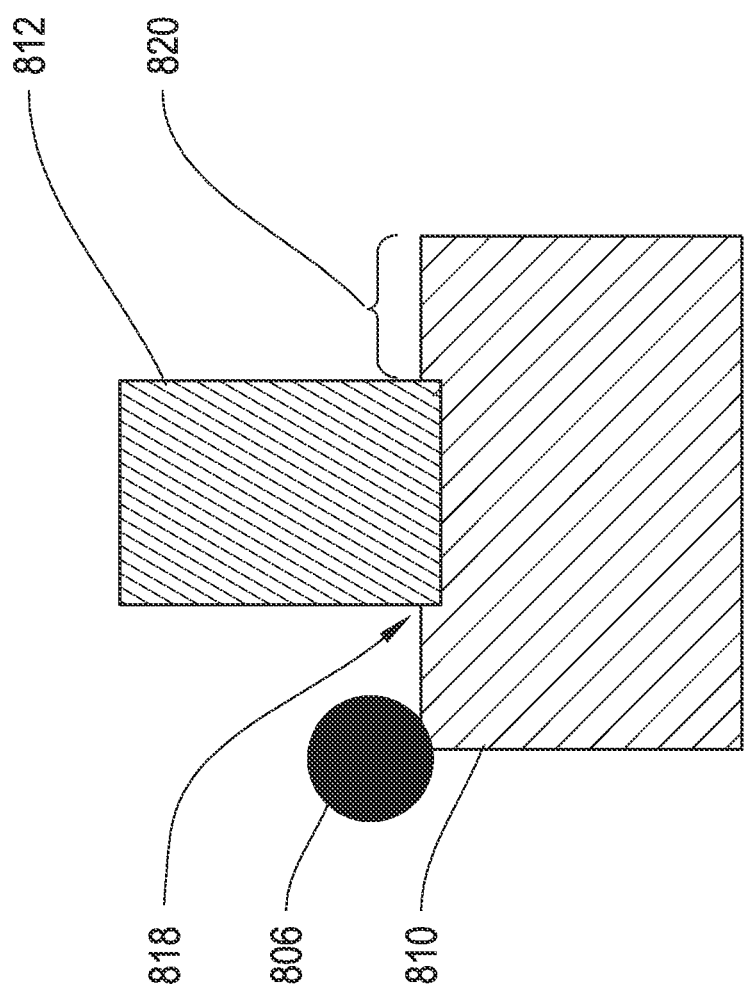
FIG. 8B is a cross-sectional view of an example filter element and a debris particle.

FIG. 8B is a cross-sectional view of example filter element and a debris particle. The second filter elements 812 are stacked on top of the first filter elements 810. In some implementations, the first filter elements 810 are formed on the substrate, and the second filter elements 812 are formed on the plate. In some implementations, one or both of the first filter elements 810 and the second filter elements 812 are integrally formed. When the substrate and the plate are joined together, the first 810 and second 812 filter elements align to form filter columns. In some other implementations, the first filter elements 810 are formed on the plate and the second filter elements 812 are formed on the plate. In some implementations, one or both of the first filter elements 810 and the second filter elements 812 are integrally formed on the plate. In some implementations, the ability to photo define the filter on one substrate is limited to the minimum line widths achievable with photolithography methods. For example, the filter elements are about three micrometers wide, however, the width of the filter elements can vary based on the design parameters, as a person having ordinary skill in the art will readily comprehend.

First gaps 814 between the first filter elements 810 allow fluid to pass between them. However, non-fluidic particles 806 are inhibited from passing between the first filter elements 810. In various implementations, the first gaps 810 may be about one micrometer wide, and the first gaps 810 may be less than about one micrometer wide. The second gaps 816 between the second filter elements 812 allow fluid to pass between the second filter elements 812. The second gaps 816 may be spaced to inhibit non-fluidic particles 806 from passing between the second filter elements 812. For example, the second gaps 816 may be about one micrometer wide, or the second gaps 816 may be less than about one micrometer wide. According to one feature, once a non-fluidic particle is inhibited by a first filter element 810 or a second filter element 812, the particle remains in place at the first 810 or second 812 filter element, substantially permanently.

As shown in FIGS. 8A and 8B, the first filter elements 810 are cylindrical and have a larger diameter or width than the second filter elements 812. The second filter elements 812 are substantially rectangular, and have a smaller width than the first filter elements 810. In some implementations, as shown in FIG. 8B, a corner 818 and a shelf 820 are created by the positioning of a smaller second filter element 812 on a larger first filter element 810. The corner 818 and the shelf 820 are spaces where non-fluidic particles are likely to be held in place when the particles are inhibited from entering the main body of the display. According to other implementations, the first filter elements 810 and the second filter elements 812 may have any other shape, as described above with respect to the first 710 and second 712 filter elements of FIG. 7. In some implementations, the first filter elements 810 may be smaller than the second filter elements 812.

Figure 9A:
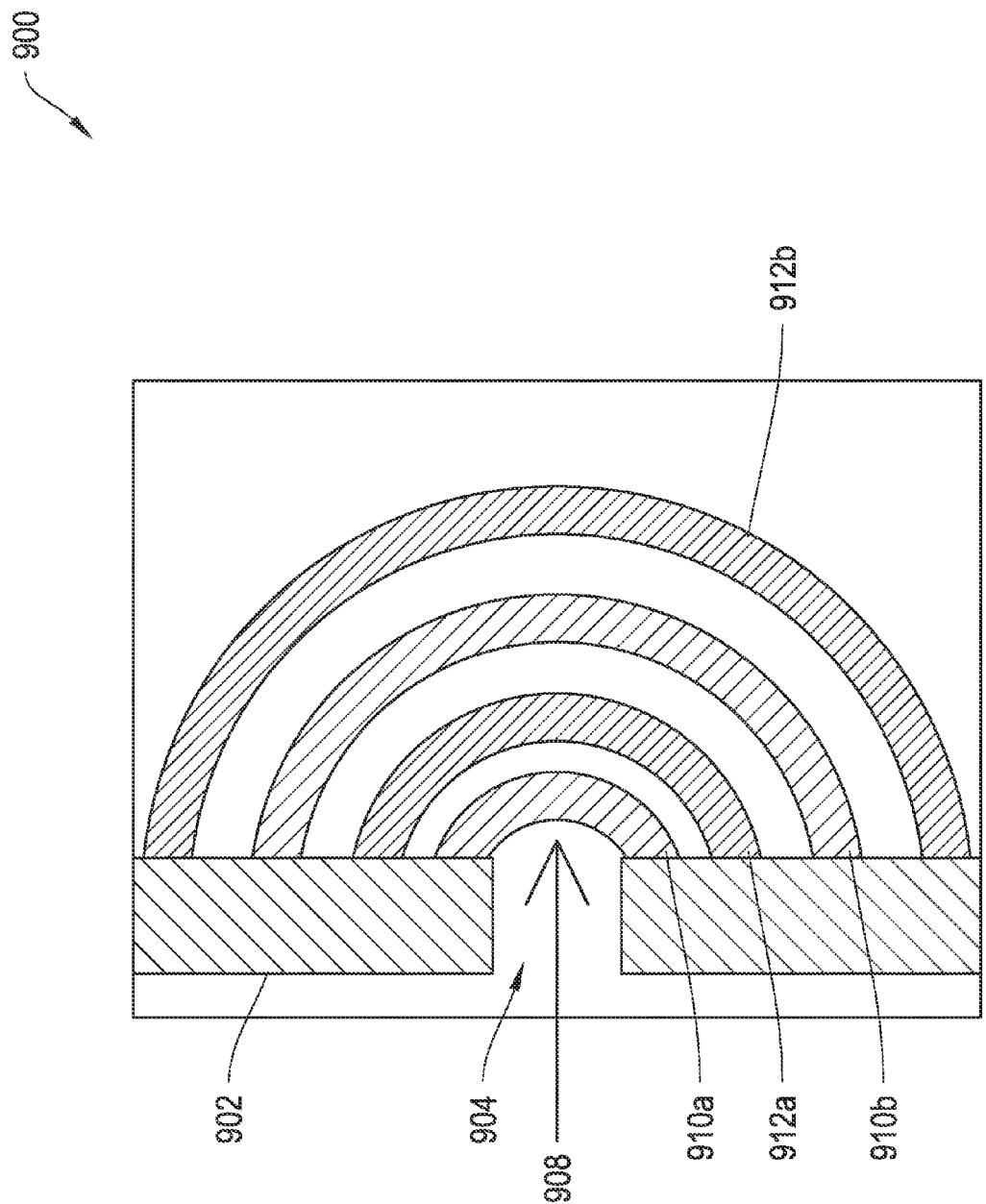
FIG. 9A depicts an example of a filter having arched filter elements.

FIG. 9A depicts an example of a filter having arched filter elements. The portion of the display 900 shown in FIG. 9A has a filter including first 910a, second 912a, third 910b and fourth 912b filter elements. The display 900 includes a seal 902 and a fill port 904. The fluid 908 can be injected into the display at the fill port 904. The filter is positioned inside the display near the fill port 904, to inhibit non-fluidic particles as they enter the display 900, before the non-fluidic particles reach electromechanical components inside the main body of the display 900. As shown in FIG. 9A, the first 910a, second 912a, third 910b and fourth 912b filter elements are arch-shaped, and form concentric semi-circles centered at the fill port 904. Each of the arch-shaped semi-circular filter elements 910a, 912a, 910b and 912b form a wall on one of the plate and the substrate. The concentric semi-circular filter elements 910a, 912a, 910b and 912b are laterally adjacent. The first 910a, second 912a, third 910b and fourth 912b filter elements extend towards the opposite display surface (i.e., the substrate or the plate), but do not abut the opposite surface, leaving space for fluid to pass by the filter. In some implementations, the first 910a and third 910b filter elements are formed on the substrate, and the second 912a and fourth 912b filter elements are formed on the plate. In some implementations, the first 910a and third 910b filter elements are integrally formed on the substrate, and the second 912a and fourth 912b filter elements are integrally formed on the plate. According to another implementation, the first 910a and third 910b filter elements are integrally formed on the plate, and the second 912a and fourth 912b filter elements are integrally formed on the substrate. When the substrate and the plate are joined together, each of the first 910a, second 912a, third 910b, and fourth 912b filter elements are spaced apart from each other in concentric semi-circles.

Figure 9B:
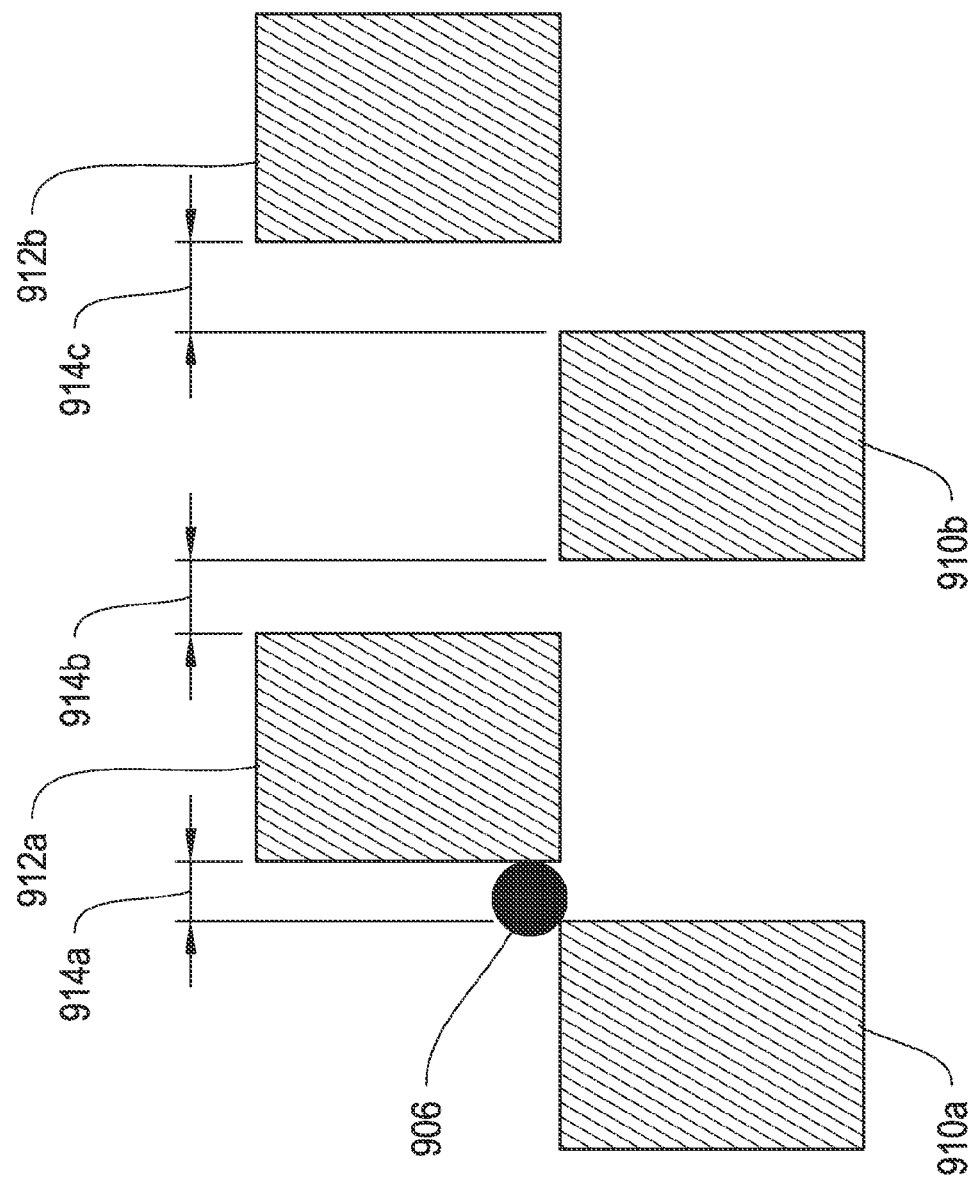
FIG. 9B is a cross-sectional view of example filter elements and a debris particle.

FIG. 9B is a cross-sectional view of example filter elements and a debris particle. As shown in FIG. 9B, the first 910a and third 910b filter elements are formed on the substrate, and the second 912a and fourth 912b filter elements are formed on the plate. As shown in FIG. 9B, the filter elements 910a, 912a, 910b, and 912b are arranged in an alternating pattern. In particular, the first filter element 910a, formed on the substrate, is closest to the fill port 904, then there is a first gap 914a and then the second filter element 912a, formed on the plate, then a second gap 914b and then the third filter element 910b, formed on the substrate, and then a third gap 914c and the fourth filter element 912b, formed on the plate. According to some implementations, at least one of the first 914a, second 914b, and third 914c gaps is at most about one micrometer wide. In various implementations, the filter elements 910a, 910b, 912a, and 912b have various heights. For example, the first 910a and third 910b filter elements may be taller than shown in FIG. 9B, such that the first 910a and third 910b filter elements would overlap with the second 912a and fourth 912b filter elements if they were not spaced apart by the first 914a, second 914b, and third 914c gaps. In another implementation, the first 910a and third 910b filter elements may be shorter than shown in FIG. 9B. In some implementations, the first 910a filter element and the third 910b filter element have different heights. Similarly, the second 912a and fourth 912b filter elements may be taller or shorter than shown in FIG. 9B, and the second filter element 912a may have a different height from the fourth filter element 912b.

In some implementations, the design of the filter elements shown in FIGS. 9A and 9B can trap particles having a dimension of about one micrometer since the first 914a, second 914b, and third 914c gaps may be about one micrometer or less than about one micrometer. In various implementations, the first 914a, second 914b and third 914c gaps may each have a different width, and in one example, at least one of the first 914a, second 914b and third 914c gaps has a width that is about one micrometer or less than about one micrometer. The width of the gaps 914a, 914b, and 914c may depend on the precision of assembly of the display.

The filter elements 910a, 910b, 912a and 912b shown in FIGS. 9A and 9B are semi-circular. However, in other implementations, one or more of the filter elements 910a, 910b, 912a and 912b may have any other shape, such as any curved arch-shaped, a multi-sided shape including one or more straight sides, and a multi-sided shape including one or more curved sides. In some implementations, one or more of the filter elements 910a, 910b, 912a and 912b may not contact the seal 902, and there may be a small space between the seal and a filter element 910a, 910b, 912a or 912b.

Figure 10A:
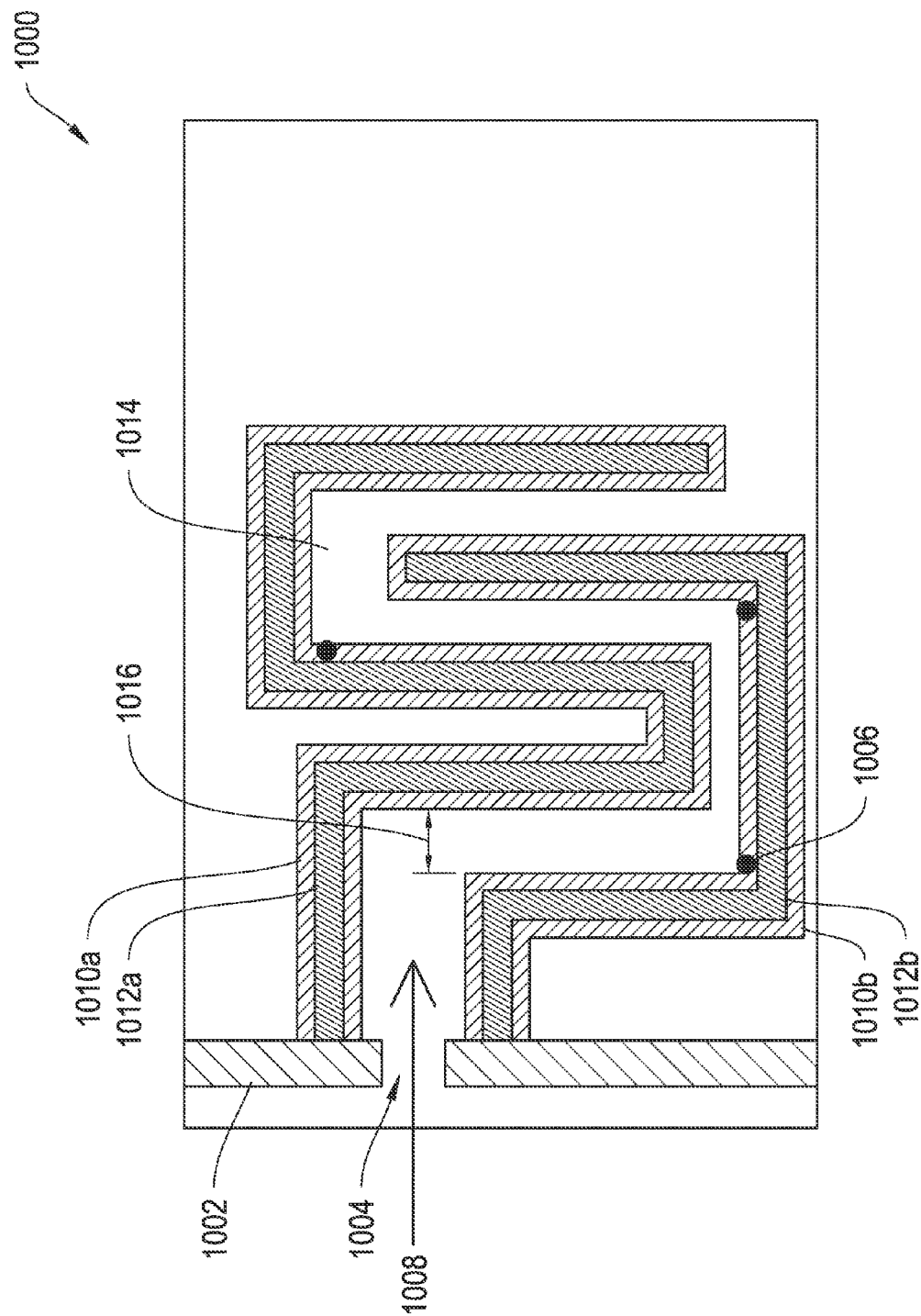
FIG. 10A depicts an example of a filter forming a channel.

FIG. 10A depicts an example of a filter forming a channel. The portion of the display 500 shown in FIG. 10A has a filter in the form of a channel 1014, including first 1010a, second 1010b, third 1012a, and fourth 1012b filter elements. The display 1000 includes a seal 1002 and a fill port 1004. The fluid 1008 is injected into the display at the fill port 1004, and follows the path of the channel 1014 into the main body of the display 1000. The filter elements 1010a, 1010b, 1012a, and 1012b are elongated elements or walls. The first filter element 1010a is laterally adjacent to the second filter element 1010b, and the third filter element 1012a is laterally adjacent to the fourth filter element 1012b, and the filter elements 1010a and 1010b, and 1012a and 1012b are spaced apart to form the channel 1014. The filter elements 1010a, 1010b, 1012a, and 1012b inhibit non-fluidic particles 1006 as they enter the display 1000 at the fill port 1004 and before the non-fluidic particles 1006 reach electromechanical components inside the main body of the display 1000. In some implementations, the first 1010a and second 1010b filter elements are integrally formed on the substrate, and the third 1012a and fourth 1012b filter elements are integrally formed on the plate.

The channel 1014 as shown includes five L-shaped turns, resulting in several corners. According to one feature, as the fluid 1008 moves through the channel 1014, non-fluidic particles 1006 in the fluid touch the sides and corners of the channel and attach to the filter elements 1010a, 1010b, 1012a and 1012b. As shown in FIG. 10A, three of the five corners in the channel 1014 contain non-fluidic particles 1006. According to one feature, once a non-fluidic particle 1006 stops at a filter element 1010a, 1010b, 1012a, 1012b, the non-fluidic particle 1006 remains in place at the filter element 1010a, 1010b, 1012a, 1012b. Although the channel 1014 shows five turns, in other implementations, the channel 1014 may include any number of turns. Additionally, although the turns on the channel 1014 are L-shaped, turning at about ninety-degree angles, in other implementations, the turns may form any other angle. For example, the turns may form about a 45 degree angle, or the turns may form about a 120-degree angle. In other implementations, the turns may be rounded, and the turns may be arch-shaped.

The channel 1014 has a width 1016. The width 1016 may be less than about three micrometers, about three micrometers, about five micrometers, about ten micrometers, or more than about ten micrometers. The width 1016 may vary along the length of the channel.

Figure 10B:
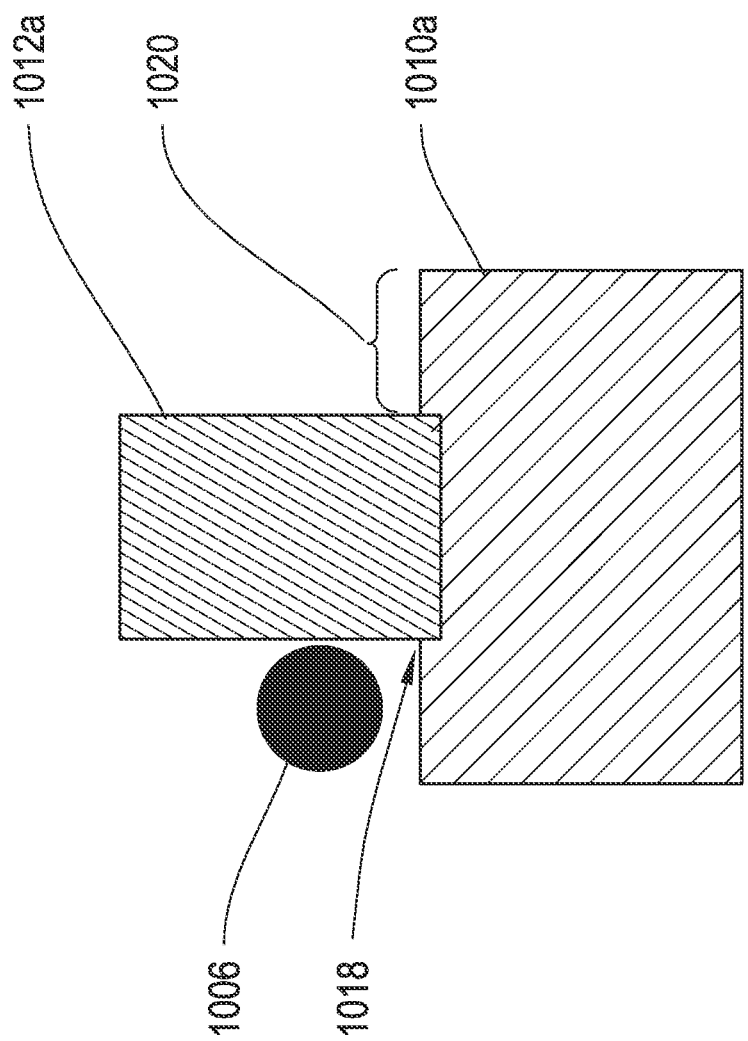
FIG. 10B is a cross-sectional view of example filter elements and a debris particle.

FIG. 10B is a cross-sectional view example filter elements and a debris particle. As shown in FIGS. 10A and 10B, the first filter element 1010a has a larger width than the third filter element 1012a. In some implementations, a corner 1018 and a shelf 1020 are created by the positioning of the smaller third filter element 1012a on the larger first filter element 1010a. The corner 1018 and the shelf 1020 are spaces where non-fluidic particles are likely to be stop and be held in place, preventing the non-fluidic particles from entering the main body of the display. In some other implementations, the first 1010a and third 1012a filter elements may have other shapes and sizes, and the first 1010a and third 1012a filter elements may have different sizes with respect to each other. For example, the first filter element 1010a may be smaller than the third filter element 1014a.

In some implementations, the size of a filter gap located between the substrate and the plate may be more accurately controlled by adjusting the height of a filter element than by adjusting a distance between filter elements. In one example, the main seal height is controlled by using spacers in the epoxy.

FIG. 11A depicts an example of a filter including two types of filter elements. The filter elements include first filter element 1112 and second filter element 1114. The first 1112 and second 1114 filter elements are integrally formed on at least one of the substrate and the plate of the display, and may be formed of the same material as the substrate or the plate. As shown in the example in FIG. 11A, the first filter element 1112 forms one continuous filter element. The filter elements 1112 and 1114 are positioned around space in the seal 1102, which remains open as a fluid fill port for injecting a fluid into the display. In one example, the first filter element 1112 is formed on the plate of the display, and the second filter element 1114 is formed on the substrate of the display.

FIG. 11B is a cross-sectional view of example filter elements. FIG. 11B shows the first filter element 1112 and the second filter element 1114 of FIG. 11A, and also shows the seal 1102, which is the seal around the entire display. As shown in the cross-sectional view, the seal 1102 has a first height "a" 1104. The first filter element 1112 has a second height "b1" 1106 and the second filter element 1114 has a third height "b2" 1108. The space 1110 between the first 1112 and second 1114 filter elements is the first height "a" 1104 minus the second height "b1" 1106 and minus the third height "b2" 1108. In some implementations, the space 1110 between the first 1112 and second 1114 filter elements is about one micrometer, or less than about one micrometer. According to one application, the seal 1102 is an epoxy seal. According to one feature, the height of the space 1110 can be controlled to tenths of a micrometer.

Figure 12:
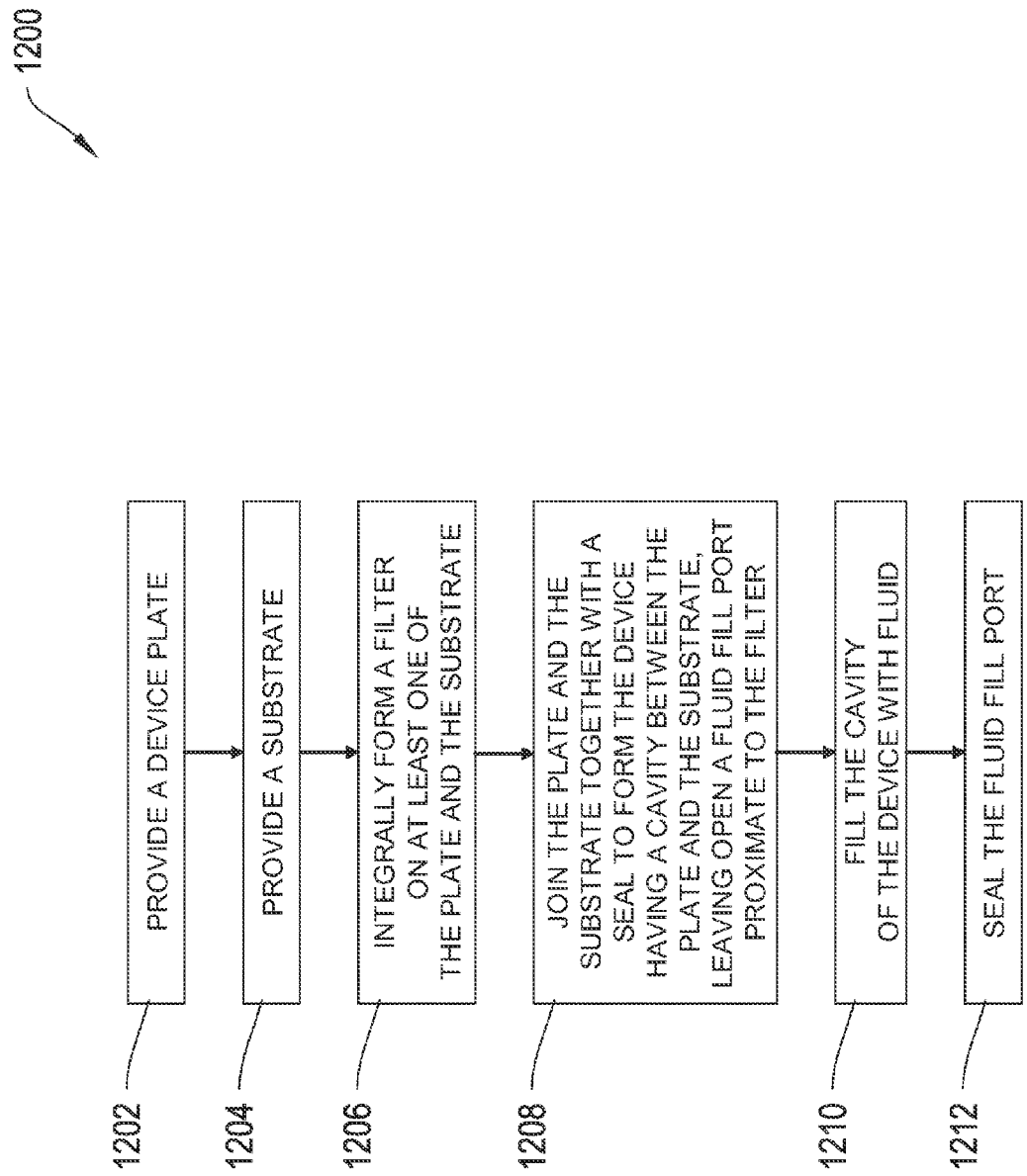
FIG. 12 is a flow diagram of an example method for manufacturing a device including a filter.

FIG. 12 is a flow diagram of an example method for manufacturing a device including a filter. At block 1202, a plate is provided. In some implementations, the plate is a glass plate for a display. At block 1204, a substrate is provided. In some implementations, the substrate may be the substrate for a display. At block 1206, a filter is formed on at least one of the plate and the substrate. The filter is formed by providing filter elements on at least one of the surface of the substrate and the surface of the plate. The filter elements can be formed concurrently with the forming of the plate or substrate. For example, filter elements can be formed on the substrate at the same time as EMS devices are formed on the substrate. In another example, filter elements can be formed on the plate at the same time as other structures are formed on the plate. The filter elements can be integrally formed on one or both of the substrate and the plate. The filter elements are spaced to define a gap sized to inhibit debris from passing through the filter elements. In some implementations, the gap inhibits debris having a width or diameter of about one micrometer or more. In some other implementations, the gap inhibits debris having a width or dimension that is less than about one micrometer.

To form a fluid-filled device, at block 1208, the method 1200 joins the plate and the substrate together with a seal to form the device, leaving open a cavity between the plate and the substrate. A fluid fill port is left open proximate to the filter. After the cavity of the device has been filled with fluid at block 1210, the fluid fill port is sealed at block 1212.

According to some implementations, forming the filter elements may include integrally forming multiple posts on the substrate or on the plate, which may result in a filter similar to the filter shown in FIG. 7 or FIG. 8A-8B. In some implementations, forming the filter elements includes integrally forming bumps on the surface of the plate, which also may result in a filter similar to the filter shown in FIG. 7 or FIGS. 8A-8B. The bumps may contact the substrate, and the bumps may contact one or more posts formed on the substrate. In some implementations, forming the bumps includes forming at least two walls to form a channel having a turn for directing a flow of fluid against at least one of the two walls, which may result in a filter similar to the filter shown in FIGS. 10A-10B.

In some implementations, forming the filter elements includes forming a first wall on the plate and forming a second wall on the substrate, such that when the plate and the substrate are joined, the first wall and the second wall are disposed laterally adjacent to form a filter such as the filter shown in FIGS. 9A-9B.

According to some implementations, FIGS. 9A, 9B, and 10 show implementations where the particle trapping is independent of photolithography limits. In some applications, the lithography limit in typical display processes is about three micrometers. The implementations in FIGS. 9A, 9B, 10A, 10B, 11A, and 11B can be designed to filter particles smaller than about three micrometers. According to one application, the implementations shown in FIGS. 7, 8A and 8B may be used for filtering particles larger than about three micrometers. The alignment of the substrate with the plate can be used to define a gap that is about 3 micrometers wide. In some implementations, a filter that combines two or more of the implementations shown FIGS. 7, 8A, 8B, 9A, 9B, 10A, 10B, 11A, and 11B may be used, and may be designed to filter particles smaller than about three micrometers, for example by filtering particles having a dimension that is about one micrometer or larger than about one micrometer. In some implementations, a series of filter elements with changing pitch can be used to create a gap that is about one micrometer or less than about one micrometer. In some implementations, the height of the spacers can be adjusted to create a gap as shown in FIG. 11B, and the size of the gap can be controlled to tenths of micrometers. The size of the gap shown in FIG. 11B can be less than one micrometer. In some implementations, polymer spacers can be patterned to allow for a gap having a width of about one micrometer, about 1.5 micrometers, or more than about 1.5 micrometers. In other implementations, alignment of the substrate with the plate can be used to define a gap that is less than one (1) micrometer wide.

Figure 13B:
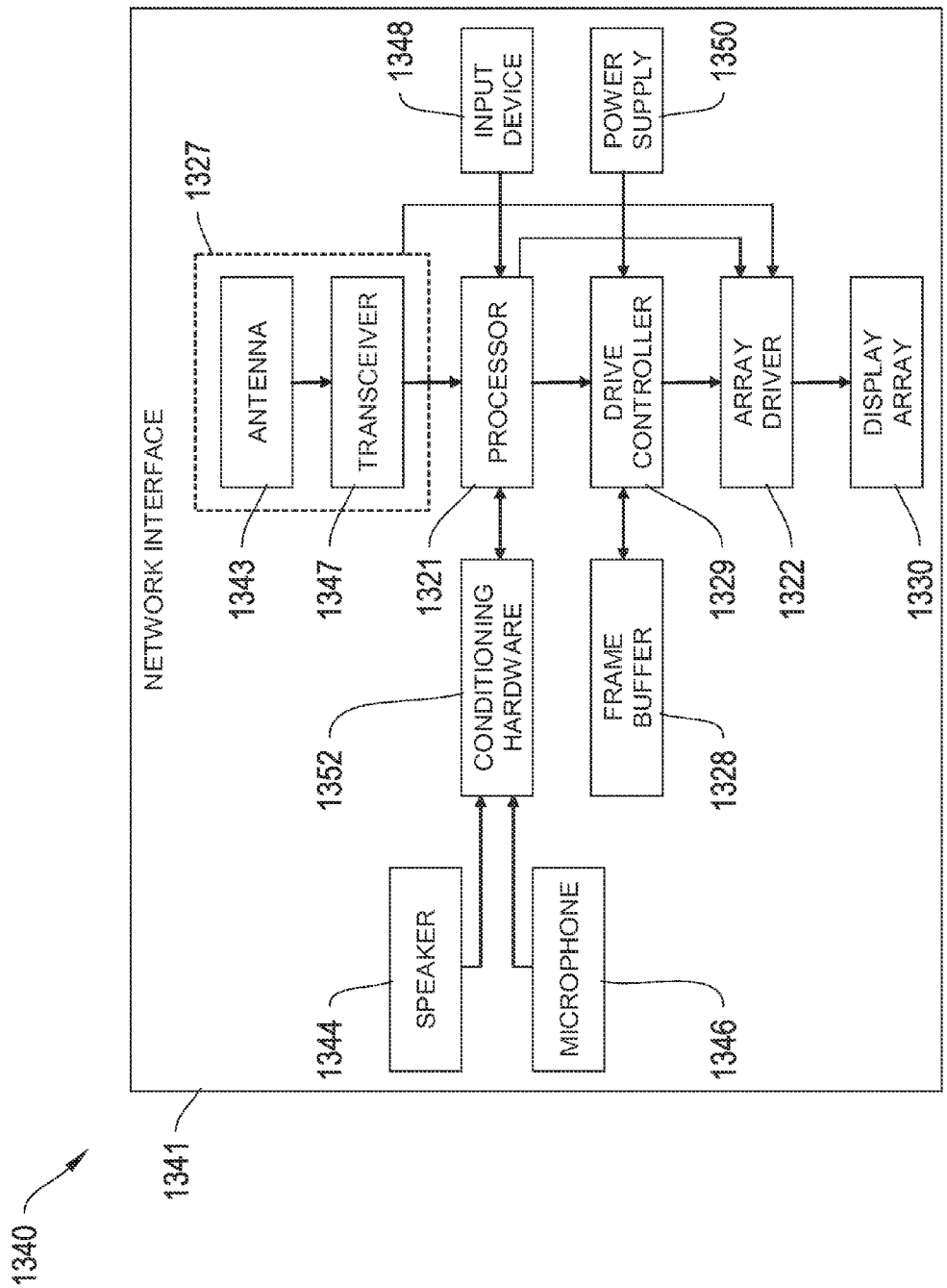

The displays described above can be used in computer systems, cellular phones, wireless devices, e-readers, netbooks, notebooks, tablets or any other device that includes a visual display. FIGS. 13A and 13B are examples of a display device and controller of the type suitable for use with the displays described herein. In particular, FIGS. 13A and 13B are system block diagrams illustrating one such display device 1340 that may include a display as described herein. The display device 1340 can be, for example, a smart phone, a cellular or mobile telephone. However, the same components of the display device 1340 or slight variations thereof are also illustrative of various types of display devices such as televisions, computers, tablets, e-readers, hand-held devices and portable media devices.

The display device 1340 includes a housing 1341, a display 1330, an antenna 1343, a speaker 1345, an input device 1348 and a microphone 1346. The housing 1341 can be formed from any of a variety of manufacturing processes, including injection molding, and vacuum forming. In addition, the housing 1341 may be made from any of a variety of materials, including, but not limited to: plastic, metal, glass, rubber and ceramic, or a combination thereof. The housing 1341 can include removable portions (not shown) that may be interchanged with other removable portions of different color, or containing different logos, pictures, or symbols.

The display 1330 may be any of a variety of displays, including a bi-stable or analog display, as described herein. The display 1330 also can be configured to include a flat-panel display, such as plasma, EL, OLED, STN LCD, or TFT LCD, or a non-flat-panel display, such as a CRT or other tube device. In addition, the display 1330 can include a light modulator-based display, as described herein.

The components of the display device 1340 are schematically illustrated in FIG. 13A. The display device 1340 includes a housing 1341 and can include additional components at least partially enclosed therein. For example, the display device 1340 includes a network interface 1327 that includes an antenna 1343 which can be coupled to a transceiver 1347. The network interface 1327 may be a source for image data that could be displayed on the display device 1340. Accordingly, the network interface 1327 is one example of an image source module, but the processor 1321 and the input device 1348 also may serve as an image source module. The transceiver 1347 is connected to a processor 1321, which is connected to conditioning hardware 1352. The conditioning hardware 1352 may be configured to condition a signal (such as filter or otherwise manipulate a signal). The conditioning hardware 1352 can be connected to a speaker 1345 and a microphone 1346. The processor 1321 also can be connected to an input device 1348 and a driver controller 1329. The driver controller 1329 can be coupled to a frame buffer 1328, and to an array driver 1322, which in turn can be coupled to a display array 1330. One or more elements in the display device 1340, including elements not specifically depicted in FIG. 13A, can be configured to function as a memory device and be configured to communicate with the processor 1321. In some implementations, a power supply 1350 can provide power to substantially all components in the particular display device 1340 design.

The network interface 1327 includes the antenna 1343 and the transceiver 1347 so that the display device 1340 can communicate with one or more devices over a network. The network interface 1327 also may have some processing capabilities to relieve, for example, data processing requirements of the processor 1321. The antenna 1343 can transmit and receive signals. In some implementations, the antenna 1343 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 1343 transmits and receives RF signals according to the Bluetooth® standard. In the case of a cellular telephone, the antenna 1343 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 1347 can pre-process the signals received from the antenna 1343 so that they may be received by and further manipulated by the processor 1321. The transceiver 1347 also can process signals received from the processor 1321 so that they may be transmitted from the display device 1340 via the antenna 1343.

In some implementations, the transceiver 1347 can be replaced by a receiver. In addition, in some implementations, the network interface 1327 can be replaced by an image source, which can store or generate image data to be sent to the processor 1321. The processor 1321 can control the overall operation of the display device 1340. The processor 1321 receives data, such as compressed image data from the network interface 1327 or an image source, and processes the data into raw image data or into a format that can be readily processed into raw image data. The processor 1321 can send the processed data to the driver controller 1329 or to the frame buffer 1328 for storage. Raw data typically refers to information that identifies the image characteristics at each location within an image. For example, such image characteristics can include color, saturation and gray-scale level.

The processor 1321 can include a microcontroller, CPU, or logic unit to control operation of the display device 1340. The conditioning hardware 1352 may include amplifiers and filters for transmitting signals to the speaker 1345, and for receiving signals from the microphone 1346. The conditioning hardware 1352 may be discrete components within the display device 1340, or may be incorporated within the processor 1321 or other components.

The driver controller 1329 can take the raw image data generated by the processor 1321 either directly from the processor 1321 or from the frame buffer 1328 and can re-format the raw image data appropriately for high speed transmission to the array driver 1322. In some implementations, the driver controller 1329 can re-format the raw image data into a data flow having a raster-like format, such that it has a time order suitable for scanning across the display array 30. Then the driver controller 1329 sends the formatted information to the array driver 1322. Although a driver controller 1329, such as an LCD controller, is often associated with the system processor 1321 as a stand-alone Integrated Circuit (IC), such controllers may be implemented in many ways. For example, controllers may be embedded in the processor 1321 as hardware, embedded in the processor 1321 as software, or fully integrated in hardware with the array driver 1322.

The array driver 1322 can receive the formatted information from the driver controller 1329 and can re-format the video data into a parallel set of waveforms that are applied many times per second to the hundreds, and sometimes thousands (or more), of leads coming from the display's x-y matrix of display elements.

In some implementations, the driver controller 1329, the array driver 1322, and the display array 1330 are appropriate for any of the types of displays described herein. For example, the driver controller 1329 can be a conventional display controller or a bi-stable display controller (such as a light modulator display element controller). Additionally, the array driver 1322 can be a conventional driver or a bi-stable display driver (such as a light modulator display element driver). Moreover, the display array 1330 can be a conventional display array or a bi-stable display array (such as a display including an array of light modulator display elements). In some implementations, the driver controller 1329 can be integrated with the array driver 1322. Such an implementation can be useful in highly integrated systems, for example, mobile phones, portable-electronic devices, watches or small-area displays.

In some implementations, the input device 1348 can be configured to allow, for example, a user to control the operation of the display device 1340. The input device 1348 can include a keypad, such as a QWERTY keyboard or a telephone keypad, a button, a switch, a rocker, a touch-sensitive screen, a touch-sensitive screen integrated with the display array 1330, or a pressure- or heat-sensitive membrane. The microphone 1346 can be configured as an input device for the display device 1340. In some implementations, voice commands through the microphone 1346 can be used for controlling operations of the display device 1340.

The power supply 1350 can include a variety of energy storage devices. For example, the power supply 1350 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 1350 also can be a renewable energy source, a capacitor, or a solar cell, including a plastic solar cell or solar-cell paint. The power supply 1350 also can be configured to receive power from a wall outlet.

In some implementations, control programmability resides in the driver controller 1329 which can be located in several places in the electronic display system. In some other implementations, control programmability resides in the array driver 1322. The above-described optimization may be implemented in any number of hardware and/or software components and in various configurations.

As used herein, a phrase referring to "at least one of" a list of items refers to any combination of those items, including single members. As an example, "at least one of: a, b or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one or more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
    a plate;
    a substrate supporting at least one electromechanical systems (EMS) device, wherein the plate and the substrate define, at least in part, a cavity housing the EMS device;
    at least one port, capable of receiving a fluid, connected to the cavity at a location between the plate and the substrate;
    and
    a filter disposed between the at least one port and the EMS device, wherein:
        the filter includes one or more first filter elements formed on the plate and one or more corresponding second filter elements formed on the substrate;
        the one or more first filter elements each have:
            a first surface facing the substrate,
            one or more first sidewalls spanning between the first surface and the plate, and
            one or more first corners defined by the intersection of the first surface with the one or more first sidewalls;
        the one or more second filter elements each have:
            a second surface facing the plate,
            one or more second sidewalls spanning between the second surface and the plate, and
            one or more second corners defined by the intersection of the second surface with the one or more second sidewalls; and
        non-fluidic particles carried in the fluid are likely to be held in place by at least one corner selected from the group consisting of a) the one or more first corners, b) the one or more second corners, and c) the one or more first corners and the one or more second corners.

2. The apparatus of claim 1, wherein the one or more second filter elements include a plurality of adjacent posts formed on the substrate and laterally spaced apart from one another to provide a defined gap.

3. The apparatus of claim 1, wherein filter elements selected from the group consisting of the one or more first filter elements, the one or more second filter elements, and the one or more first filter elements and the one or more second filter elements include spacers integrally formed on at least one of the surface of the substrate and the surface of the plate to form a part of a barrier.

4. The apparatus of claim 1, wherein the one or more first filter elements and the one or more second filter elements each include at least two walls spaced apart to form a channel configured to direct a flow of the received fluid against at least one of the walls.

5. The apparatus of claim 1, wherein the one or more first filter elements include a first wall formed on the plate and the one or more second filter elements include a second wall formed on the substrate.

6. The apparatus of claim 5, wherein the first wall and the second wall form concentric walls centered around the at least one port.

7. The apparatus of claim 1, wherein the at least one EMS device includes at least one of a liquid crystal and a microelectromechanical system (MEMS) component.

8. The apparatus of claim 7, wherein the MEMS component is selected from the group consisting of a shutter, a mirror, and a micro fluidic component.

9. The apparatus of claim 1, wherein the one or more first filter elements and the one or more second filter elements define a gap that has a width of about at least one micrometer.

10. The apparatus of claim 1, wherein the plate and the substrate form at least part a display, the apparatus further comprising:
a processor that is configured to communicate with the display, the processor being configured to process image data; and
a memory device that is configured to communicate with the processor.

11. The apparatus of claim 10, further comprising:
a driver circuit configured to send at least one signal to the display; and
a controller configured to send at least a portion of the image data to the driver circuit.

12. The apparatus of claim 10, further comprising:
an image source module capable of sending the image data to the processor, wherein the image source module comprises at least one item selected from the group consisting of: a receiver, a transceiver, and a transmitter.

13. The apparatus of claim 10, further comprising:
an input device configured to receive input data and to communicate the input data to the processor.

14. A method of manufacturing a fluid-filled device, the method comprising:
providing a plate;
providing a substrate;
forming an electromechanical systems (EMS) device on the substrate;
forming one or more first filter elements on, and proximate to a peripheral edge of, the plate, wherein each first filter element has:
a first surface configured to face the substrate when the substrate and the plate are assembled together,
one or more first sidewalls spanning between the first surface and the plate, and
one or more first corners defined by the intersection of the first surface with the one or more first sidewalls;
forming one or more second filter elements on, and proximate to a peripheral edge of, the substrate, wherein each second filter element has:
a second surface configured to face the plate when the substrate and the plate are assembled together,
one or more second sidewalls spanning between the second surface and the substrate, and
one or more second corners defined by the intersection of the second surface with the one or more second sidewalls; and
assembling the substrate and the plate together such that:
the one or more first filter elements and the one or more second filter elements form a filter, and
non-fluidic particles carried in the fluid are likely to be held in place by at least one corner selected from the group consisting of a) the one or more first corners, b) the one or more second corners, and c) the one or more first corners and the one or more second corners.

15. The method of claim 14, wherein forming the one or more second filter elements includes forming a plurality of posts on the substrate.

16. The method of claim 14, wherein forming the one or more first filter elements includes integrally forming spacers on the plate and forming the one or more second filter elements includes integrally forming spacers on the substrate, wherein the first surfaces of the spacers that are included in the one or more first filter elements contact the second surfaces of the spacers that are included in the one or more second filter elements.

17. The method of claim 16, wherein forming the spacers on the substrate includes forming at least two walls to define a channel that follows a path having at least one turn that causes fluid flowed through the channel to flow against at least one of the two walls.

18. The method of claim 14, wherein forming the one or more first filter elements includes forming a first wall on the plate and forming the one or more second filter elements includes forming a second wall on the substrate, wherein when the plate and the substrate are joined, the first wall and the second wall are laterally offset from one another to form a barrier.

19. An apparatus, comprising:
a plate;
a substrate supporting at least one electromechanical systems (EMS) device formed thereon, wherein the plate and the substrate define, at least in part, a cavity housing the EMS device;
at least one port, capable of receiving a fluid, connected to the cavity at a location between the plate and the substrate;
and
means for filtering the fluid injected into the cavity at the at least one port, wherein the means for filtering includes first filtering means integrally formed on a surface of the plate and second filtering means integrally formed on a surface of the substrate, wherein:
the means for filtering inhibits non-fluidic particles in the fluid from reaching the at least one EMS device,
the first filtering means and the second filtering means cooperate so as to provide at least one edge in a plane generally parallel to the plate and the substrate, and
the at least one edge forms a corner where non-fluidic particles are likely to be held in place.

20. The apparatus of claim 19, wherein the second filtering means includes a plurality of adjacent posts formed on the substrate and laterally spaced apart to define a gap.

21. The apparatus of claim 19, wherein the second filtering means includes spacers integrally formed on the surface of the plate to form a part of a barrier.

22. The apparatus of claim 19, wherein the first filtering means and the second filtering means each include at least two walls spaced apart to form a channel that is configured to direct a flow of the received fluid against at least one of the walls.

23. The apparatus of claim 19, wherein:
the first filtering means include a first wall formed on the plate,
the second filtering means include a second wall formed on the substrate, and
the first wall and the second wall are offset from one another to define a gap that inhibits the non-fluidic particles in the fluid from reaching the at least one EMS device.

24. The apparatus of claim 19, wherein:
the first filtering means include a first wall formed on the plate,
the second filtering means include a second wall formed on the substrate, and
the first wall and the second wall form concentric ringed walls, centered around the at least one port.

* * * * *